(12) United States Patent
Yoshida

(10) Patent No.: US 6,208,845 B1
(45) Date of Patent: Mar. 27, 2001

(54) FREQUENCY MODULATION METHOD AND FREQUENCY MODULATED SIGNAL TRANSMITTER

(75) Inventor: Tatsumasa Yoshida, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/112,196

(22) Filed: Jul. 9, 1998

(30) Foreign Application Priority Data

Aug. 21, 1997 (JP) .................................................... 9-224590

(51) Int. Cl.[7] ...................................................... H04B 1/04
(52) U.S. Cl. .............................. 455/114; 455/63; 704/226
(58) Field of Search ................................... 455/110, 114, 455/63, 501, 570, 118; 704/226, 227, 228; 381/3, 13, 14; 375/295, 296

(56) References Cited

U.S. PATENT DOCUMENTS

| | | | |
|---|---|---|---|
| 4,110,692 | * | 8/1978 | Pradal .................................. 455/110 |
| 4,578,818 | * | 3/1986 | Claydon ............................... 455/110 |
| 4,752,955 | * | 6/1988 | Torick .................................. 381/13 |
| 4,802,236 | * | 1/1989 | Walczak et al. ..................... 455/110 |
| 4,893,347 | * | 1/1990 | Eastmond et al. .................. 455/506 |
| 5,001,742 | * | 3/1991 | Wang ................................... 455/561 |

* cited by examiner

Primary Examiner—Dwayne D. Bost
Assistant Examiner—Sonny Trinh
(74) Attorney, Agent, or Firm—Rabiin & Champagne, P.C.

(57) ABSTRACT

A frequency-modulated signal transmitter and frequency modulation method are provided wherewith the linearity of an FM modulated signal is secured even when the level of frequency modulation after FM modulation is low. A level-subtraction circuit 24 is provided between a speech processing circuit 20 and a frequency modulator circuit 22 for subtracting the signal level of the speech-processed signal D2 from the speech processing circuit. The level-subtraction circuit comprises a level-subtraction stage 28, to which the speech-processed signal is input, that outputs a level-subtracted voice signal to the FM modulator circuit, and an average FM noise level setting stage 26 for setting the average level (±Esn) of the FM noise generated in the frequency modulator circuit and outputting that average FM noise level (±Esn) to the level-subtraction stage. In the level-subtraction stage, a signal in which the signal D2 and the average FM noise level (±Esn) have been added is obtained as a level-regulated voice signal, which level-regulated voice signal is sent as the modulating signal to the FM modulator circuit. The level subtraction may be implemented by either analog or digital processing.

37 Claims, 20 Drawing Sheets

24 : LEVEL-SUBTRACTION CIRCUIT

30: LEVEL-SUBTRACTION CIRCUIT  32: AVERAGE FM NOISE LEVEL SETTING STAGE
34: LEVEL-SUBTRACTION STAGE  40: 1st INVERTING AMP.  42: 1st CIRCUIT
44: 2nd CIRCUIT  46: INVERTING ADDER CIRCUIT  48: 2nd INVERTING AMP.

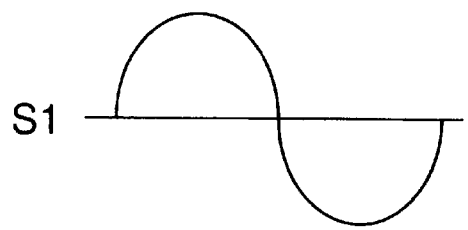
FIG. 4(A)  S1
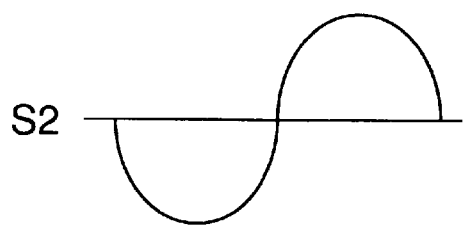
FIG. 4(B)  S2
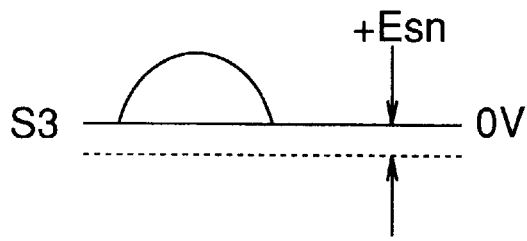
FIG. 4(C)  S3
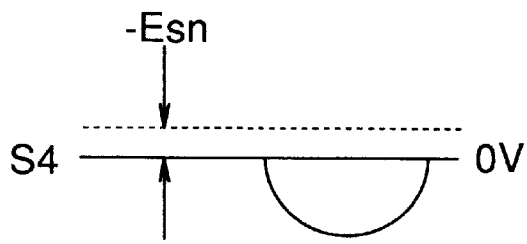
FIG. 4(D)  S4
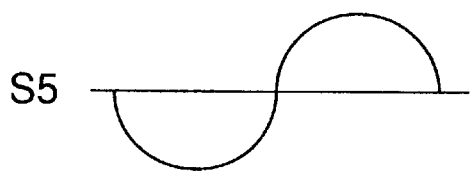
FIG. 4(E)  S5
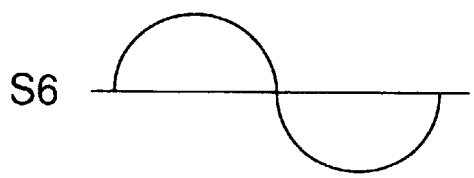
FIG. 4(F)  S6

60 : FM NOISE VOLTAGE SETTING CIRCUIT

1 : SPEECH PROCESSING CIRCUIT

*PRIOR ART*

PRIOR ART

FREQUENCY MODULATION METHOD AND FREQUENCY MODULATED SIGNAL TRANSMITTER

BACKGROUND OF THE INVENTION

1. Field of the Invention

This invention concerns a frequency modulated signal transmitter, and particularly to a transmitter used in such mobile communications apparatuses as portable telephones and automobile telephones and to a suitable frequency modulation method for application therein.

2. Description of the Related Art

In recent years, with the developments being made in automobile telephones (car phones) and portable telephones, radio communications devices for that purpose are proliferating. These communications devices modulate a carrier wave using the call voice signal as the modulating signal to produce a frequency modulated signal (FM signal), and use this FM signal to conduct communications between a base station and the mobile terminals. Portable telephones and the like which use analog modes are equipped with circuits for transmitting voice signals in the form of FM signals over radio channels. Circuitry has been proposed for such circuits, configured to prevent degradation in the S/N (signal-to-noise ratio) for weak voice signals sent by radio.

FIG. 19 is a block diagram of a conventional FM radio transmitter. This radio transmitter comprises a voice processing circuit 1 and a frequency modulating (FM) circuit 7. The voice processing circuit 1 contains circuitry for signal-processing voice inputs that are input via input terminals. The FM circuit 7 contains circuitry that modulates the frequency of a carrier wave with the voice signal that is output by the voice processing circuit 1 and signal-processed, to generate and output the FM signal.

The voice processing circuit 1 comprises a bandpass filter (BPF) 2, compressor 3, a preemphasis circuit 4, limiter circuit 5, and lowpass filter (LPF) 6. The BPF 2 filters the speech input and outputs a voice signal that is within a certain frequency band. The compressor 3 takes the voice signal from the BPF 2 and compresses it at a 2:1 compression ratio (the ratio between the compressor's input signal and output signal) centered on some reference value, and outputs the compressed signal. For the reference value, in this case, a signal level value is set at which, when the voice signal from the BPF 2 passes through the compressor 3 where it is compressed and output, out of the signal levels of the output signals, a signal is output without being compressed. The preemphasis circuit 4 outputs the output signal from the compressor 3 after emphasizing its higher-level components. The limiter circuit 5 outputs the high-level emphasized signal after limiting its amplitude. The LPF 6 is a lowpass filter that removes the harmonic waves components from the amplitude-limited signal. The signal from which the harmonic waves have been removed by this filter is then output.

With the conventional FM radio transmitter configured in this manner, weak voice signals are enhanced by compressing the voice signal with the compressor 3. The preemphasis circuit 4 emphasizes the high levels of the voice signal compressed by the compressor circuit 3. This high-level emphasized voice signal then passes sequentially through the limiter circuit 5 and LPF 6, and is input as the modulating signal to the FM modulating circuit 7. This circuit 7 outputs a frequency modulated signal (FM signal). By processing the signals in this manner, S/N ratio degradation in weak voice signals carried as radio signals can be prevented.

The FM signal originating from this transmitter is received by a radio receiver (not shown in the drawings). At the radio receiver, the received FM signal is FM demodulated. Then the high levels in the demodulated signal are restored in a deemphasis circuit. After that, the signal to which the higher levels have been restored is restored to the original voice signal by an expander, at a 1:2 expansion ratio, referencing a reference level chosen to correspond with the sending end.

As described in the foregoing, in the conventional FM radio transmitter, the voice signal compressed by the compressor 3 is FM modulated with a certain level of modulation by the FM modulator circuit 7.

Let it be assumed that the reference value for the output of the compressor 3 is −20 dBv. Now, when this −20 dBv signal is modulated with a frequency deviation of ±1.5 kHz, the necessary voice level range is, in the Narrow Advanced Mobile Phone Service (NAMPS) system, from ±5.0 kHz to ±267 kHz. That being the case, the carrier wave must be modulated in the FM modulator circuit by a modulating signal, according to the output from the compressor 3, and then transmitted.

Now, if one follows the standards of the AMPS (TIA/EIAIS-19B) system (where AMPS is the Advanced Mobile Phone Service) and the NAMPS system, the maximum frequency deviation that is FM modulated in response to the compressor output signal level must exhibit linear proportionality.

However, FM noise is generated in the FM modulator circuitry, so that an FM noise component is added to the voice signal. The maximum frequency deviation becomes larger by the size of this added noise component. As a consequence, the level of the modulating signal of the output signal from the compressor 3 and the level of frequency modulation after FM modulation can exceed the standards for FM modulation level relative to signal input level as established in the NAMPS and AMPS systems.

FIG. 20 is a graph for describing maximum frequency deviation when FM modulating in response to a compressor output signal level. The level of the signal output from the compressor (in dBv) is plotted on the horizontal axis, and the maximum frequency deviation (in Hz) is plotted on the vertical axis. In this graph in FIG. 20, the FM noise (±50 Hz) is shown superimposed on the output signal level. In FIG. 20, the straight line a1 represents the maximum frequency deviation vs. the compressor 3 output signal level reference characteristic. The output signal level and the maximum frequency deviation ordinarily are directly proportional. On either side of the straight line a1 are two straight lines b1 and c1 that are both parallel to the line a1. The respective intervals between these straight lines represent standard value widths for the output signal level from the compressor 3 as based on the U.S. TIA/EIA standard IS-90 (Recommended Minimum Standard for 800 MHz Dual-Mode Narrow Band Analog Cellular Subscriber Units). The straight line b1 exhibits upper and lower limiting values for the standard value fluctuation width from below the reference level (in this case, −20 dBv (1.5 kHz peak deviation) to −35 dBv (267 Hz peak deviation)), the fluctuation width of which is ±1 dB. Straight line c1 exhibits upper and lower limiting values for the standard value fluctuation width from below the reference level (in this case, −20 dBv (1.5 kHz peak deviation) to −9.54 dBv (5 kHz peak deviation)), the fluctuation width of which is ±0.5 dB.

Now, the FM noise components actually generated by the FM modulator circuitry comprise, for example, power supply fluctuations in the FM modulator circuitry and an oscillation frequency fluctuation component caused by hiss noise. Curve d1 in FIG. 20 represents the characteristic when this FM noise (±50 Hz) is superimposed on the output signal from the compressor 3. As may be understood from FIG. 20, when such FM noise is superimposed, if the compressor 3 output signal level is lower than around −30 dBv, then this output signal level and the maximum frequency deviation diverge sharply from their proportional relationship.

Let it be now assumed that the compressor output signal level is −35 dBv, and that FM noise (+50 Hz) is superimposed on this output signal. We can see from FIG. 20 that, in this case, the maximum frequency deviation resulting from the output signal from the compressor 3 will be 267 Hz. When FM noise components such as described above become superimposed on the maximum frequency deviation resulting from this output signal, the maximum frequency deviation for the signal output from the FM modulator circuit will be 267 Hz±50 Hz=317 Hz or 217 Hz. These values exceed the fluctuation standard ±1 dB (267 Hz±32.75 Hz) limiting values that are below the compressor fluctuation reference level (−20 dBv) which is the NAMPS (TIA/EIA IS-90) modulation standard.

When FM noise is superimposed on a voice signal, what has been done in the past, in general, is to lower the radio FM noise level and surrounding circuit noise level in order to eliminate the problems caused by FM noise. When this procedure is implemented, however, in a frequency modulated signal transmitter comprised of a combination of various circuits, it is exceedingly difficult to reduce FM noise down to a level at which, in practice, it poses no problem.

Accordingly, an object of the present invention is to provide a frequency modulated signal transmitter wherewith the effects of FM noise components and surrounding circuit noise are suppressed, even if the level of frequency modulation after FM modulation is low, and wherewith the linearity of the FM modulating signal can preserved.

SUMMARY OF THE INVENTION

According to the frequency modulation method of the present invention, then, the average voltage of the FM noise generated in the FM modulating circuit is first of all detected as an average FM noise level. The input voice signal is passed through a speech processing circuit, and the speech-processed voice signal generated by the speech processing circuit has subtracted from its level only the average FM noise level, yielding a level-regulated voice signal. This level-regulated voice signal is sent to the FM modulator circuit as the modulating signal and FM modulation is performed.

The frequency modulated signal transmitter of the present invention comprises a level-subtracting circuit between a speech processing circuit that signal-processes a voice input and generates a speech-processed signal, and a frequency modulator circuit that modulates a carrier wave frequency with a modulating frequency and generates a frequency modulated signal. The level-subtracting circuit, moreover, is configured with an average FM noise level setting stage and a level-subtracting stage. In the average FM noise level setting stage, the average FM noise level (voltage) is set for the FM noise level (voltage) of the FM noise signals generated in the frequency modulator circuit. Also, in the level-subtracting stage, the average FM noise level (voltage) is subtracted from the signal level of the speech-processed signal to yield a level-regulated voice signal. This level-regulated voice signal is sent as the modulating signal to the frequency modulator circuit.

According to the configuration of the method and apparatus inventions described in the foregoing, an average FM noise level is set from the FM noise level produced in the frequency modulator circuit, this average FM noise level portion only is removed from the signal level of the speech-processed signal, thus regulating the signal level of the speech-processed signal, and, in response to this level-regulated voice signal, FM modulation is performed in the frequency modulator circuit. Thus it is possible to preserve the linearity of the FM modulation level at low voice signal levels and, accordingly, to preserve the linearity of the FM modulated wave relative to the voice input signal level, i.e. the linearity of the maximum frequency deviation of the frequency modulated signal.

By means of the configuration of the method and apparatus inventions described in the foregoing, the FM modulation level relative to the input signal level is sharply improved as compared to the prior art.

BRIEF DESCRIPTION OF THE DRAWINGS

The foregoing and other objects, features and advantages of the present invention will be better understood from the following description taken in connection with accompanying drawings, in which:

FIG. 1(A) is a block circuit diagram wherein the average FM noise level is measured beforehand, and this is then set in the average FM noise level setting stage. FIG. 1(B) is a block circuit diagram wherein the average FM noise level is automatically measured, and this is automatically set in the average FM noise level setting stage.

FIGS. 4(A)–4(F) are signal waveform diagrams used in describing a level-subtraction circuit;

DESCRIPTION OF THE PREFERRED EMBODIMENTS

Detailed descriptions will now be given of the preferred embodiments of the frequency modulated signal transmitter of the present invention, making reference to the drawings.

FIGS. 1(A) and 1(B), respectively, diagram the overall structure of the frequency modulated signal transmitters to which the present invention pertains.

The transmitters of the present invention comprise a speech processing circuit 20, a frequency modulator circuit (FM modulator circuit) 22, and a level-subtraction circuit 24. The level-subtraction circuit 24 in turn comprises an average FM noise level setting stage 26 and a level-subtraction stage 28.

Figure 19:
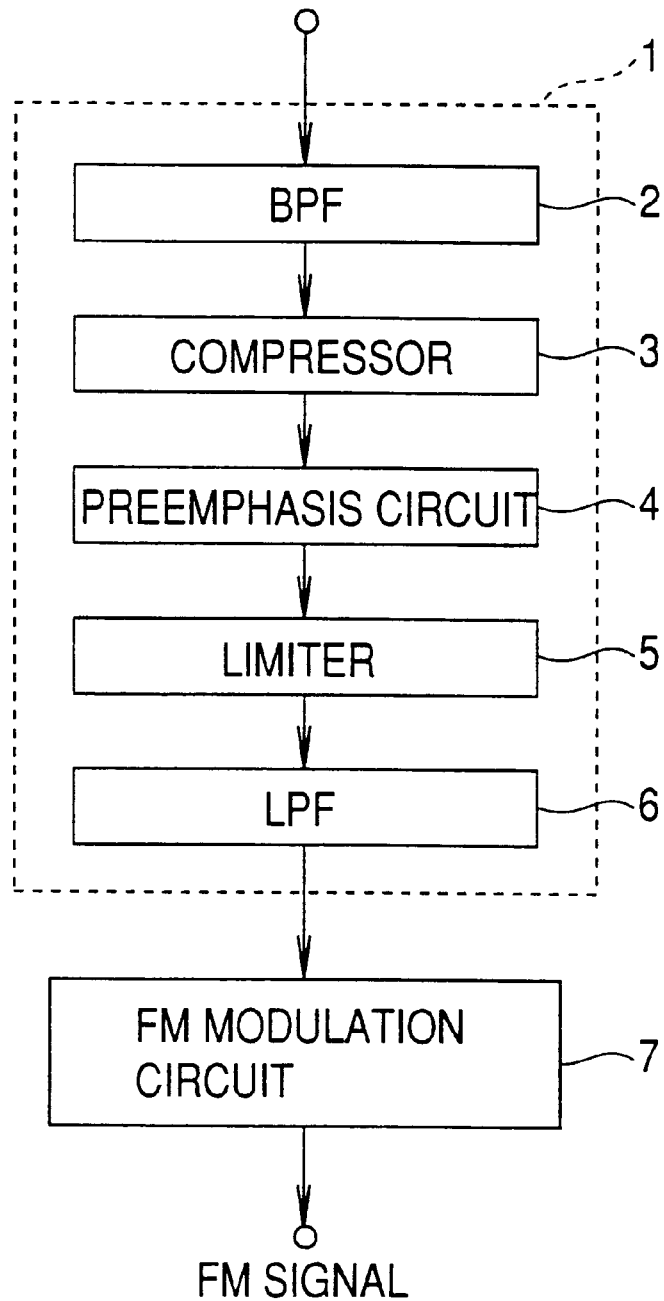
FIG. 19 is a block diagram of a conventional frequency modulated signal transmitter.

The speech processing circuit 20 has the same configuration as the conventional speech processing circuit 1 described with reference to FIG. 19. This circuit 20 processes in the conventional manner and outputs a speech-processed voice signal (hereinafter referred to as a speech-processed signal).

The frequency modulator circuit 22 uses this speech-processed signal whose signal level (i.e. voltage level) was adjusted in the level-subtraction stage 28, that is to say, the level-regulated voice signal, as the modulating signal, performs frequency modulating processing, and generates the frequency modulated signal (FM signal), which it then radio-transmits.

The average FM noise level setting stage 26 sets the average FM noise level for the frequency modulation noise generated internally by the frequency modulator circuit 22, and outputs that to the level-subtraction stage 28.

The level-subtraction stage 28 subtracts only this average FM noise level component from the signal level of the speech-processed signal supplied by the speech processing circuit 20, and generates and outputs the level-regulated voice signal described above.

Supplementing this description of the basic configuration, the transmitter of the present invention is described below in greater detail in terms of a first through a fifth embodiment. In describing these embodiments, a radio transmitter is in view.

Figure 1:
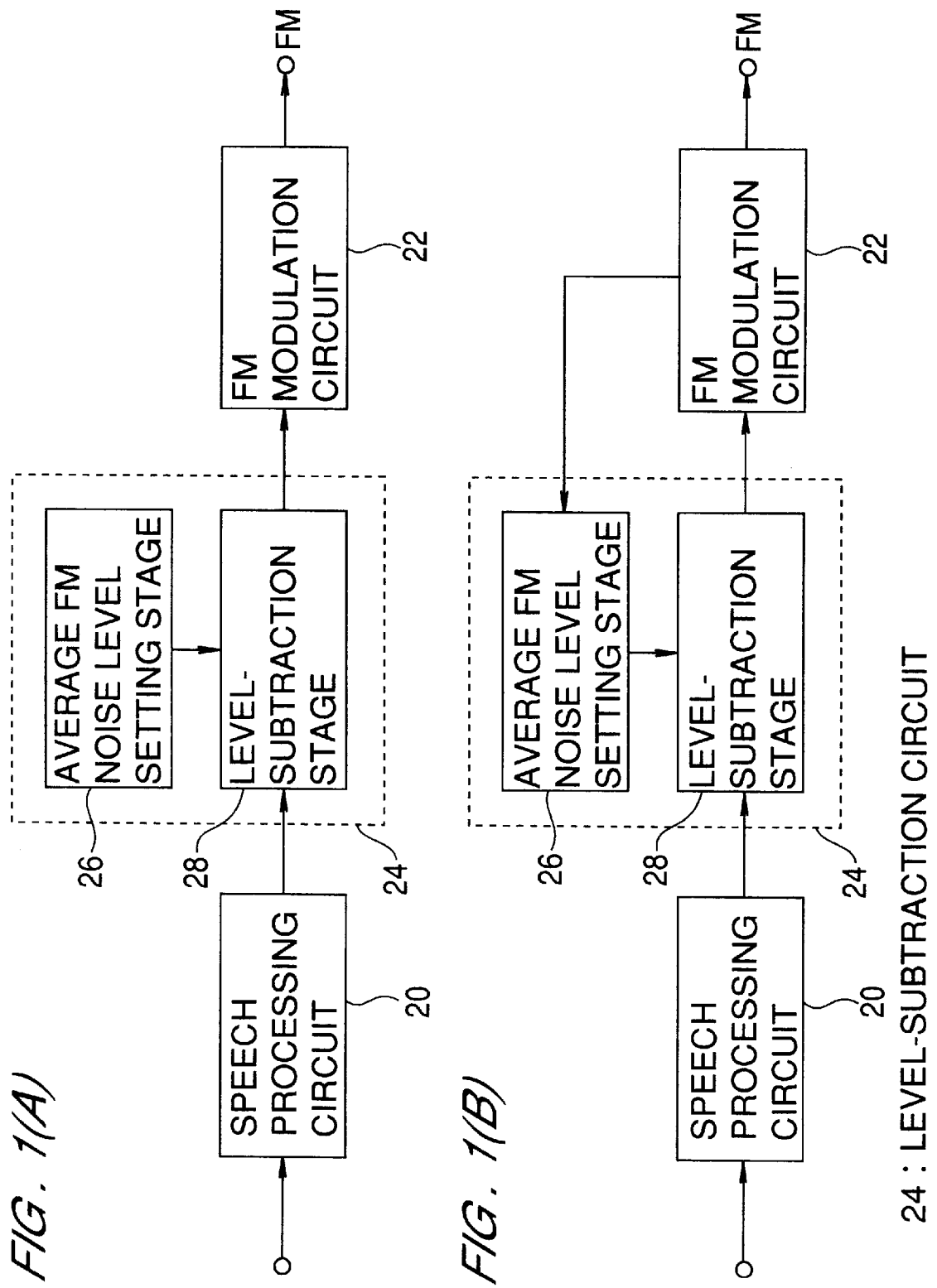
FIG. 1 is a basic block diagram of the frequency modulated signal transmitter of the present invention.
Figure 2:
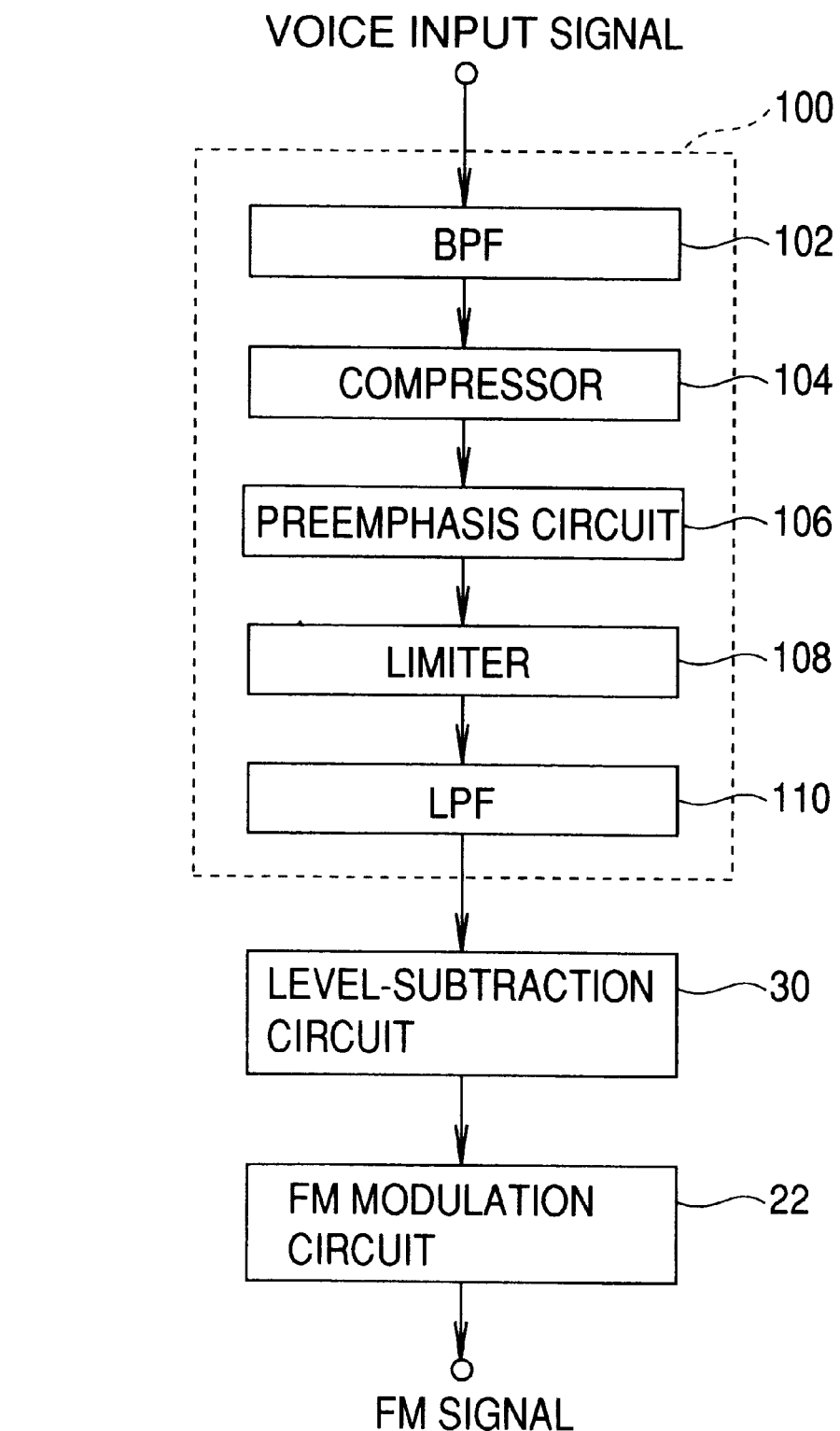
FIG. 2 is a block diagram of an example configuration of a transmitter corresponding to FIG. 1(A), provided for describing a first embodiment of the frequency modulated signal transmitter of the present invention.

FIG. 2 is a block circuit diagram corresponding to FIG. 1(A), provided for describing the frequency modulated radio transmitter in a first embodiment of the present invention.

In FIG. 2, the speech processing circuit 100 is configured the same as a conventional transmitter speech processing circuit. More specifically, the speech processing circuit 100 is an analog processing circuit that comprises a bandpass filter (BPF) 102 that filters the voice input to produce a voice signal in a certain band, a compressor 104 that compresses the output from the BPF 102 at a 2:1 compression ratio centered on a reference value, a preemphasis circuit 106 that emphasizes the higher-level components in the output from the compressor 104, a limiter 108 that limits that output, and a lowpass filter (LPF) 110 that outputs the signal component of the output signal from the limiter 108 from which the harmonic wave components have been removed.

Firstly, the voice input signal input to the speech processing circuit 100 has its necessary signal frequency component extracted by the BPF 102. The output signal from the BPF 102 goes to the compressor 104 where it is subjected to a 2:1 compression relative to a designated reference value. If the reference value is set to −20 dBv, for example, and the input signal level going to the compressor 104 is 0 dBv, then the output signal level coming from the compressor 104 will be −10 dBv. And when a −40 dBv signal is input to the compressor 104, the output signal level from the compressor 104 will be at −30 dBv.

The signal compressed by the compressor 104 goes to the preemphasis circuit 106 where it is gain-adjusted on the low-level and high-level sides, referenced against a designated frequency. If the reference frequency is designated as 1000 Hz in the 300 Hz–3 kHz voice spectrum, the compressed signal will be attenuated from the reference frequency by 6 dB/oct on the low-level side, and the gain will be increased by 6 dB/oct on the high-level side.

The resulting signal, adjusted for gain, is sent to the limiter 108. The limiter 108 outputs this signal after limiting it so that no signal is output above a certain level. The output signal from the limiter 108 goes to the LPF 110, where unnecessary harmonic wave signal components are removed. Then the speech-processed voice signal is output from the LPF 110.

The speech-processed output signal from the LPF 110 is sent to a level-subtraction circuit 30 (cf. FIG. 2). In this circuit 30, the average FM noise level component (+$E_{sn}$ or −$E_{sn}$) only is subtracted from the signal level of the output signal from the LPF 110, and the resulting level-regulated voice signal is output. This level-regulated voice signal is input to the FM modulator circuit 22 where it is used as the modulating signal to generate an FM signal.

The circuitry details of the level-subtraction circuit 30 and an example of its operation are next described with reference to FIGS. 3 and 4.

Figure 3:
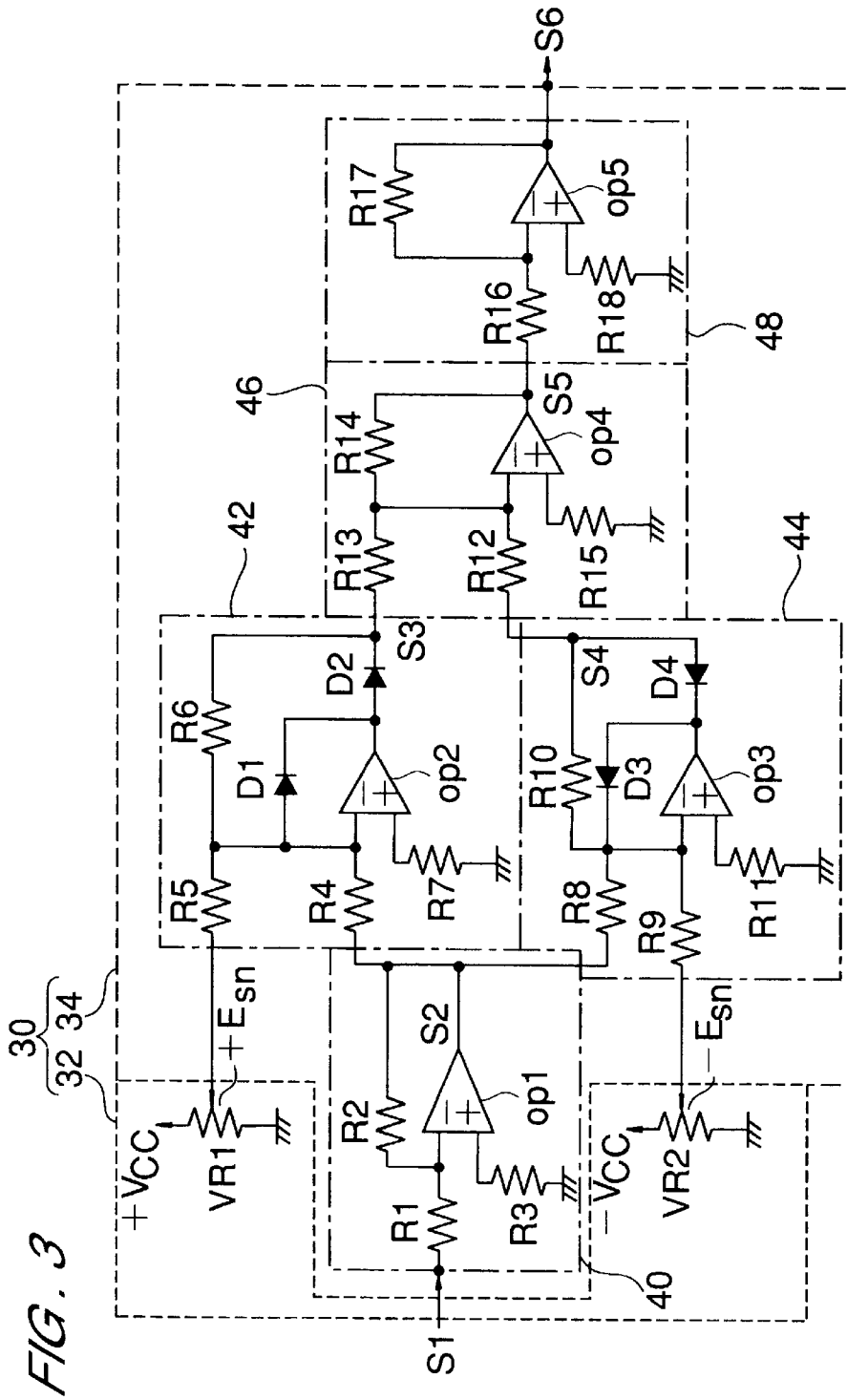
FIG. 3 is a block diagram of an example configuration of a preferred level-subtraction circuit for application in the transmitter diagrammed in FIG. 2.

FIG. 3 is a circuit diagram for the level-subtraction circuit 30 provided in this transmitter. FIG. 4 is a group of signal waveform diagrams for describing this circuit.

The level-subtraction circuit 30, as already noted, comprises an average FM noise level setting stage 32 and a level-subtracting stage 34. The average FM noise level setting stage 32 is here configured by two variable resistors VR 1 and VR 2. The first variable resistor VR 1 is connected between a first reference potential point, for example the power supply voltage (+Vcc) terminal, and a second reference potential point, for example ground. The second variable resistor VR 2 is connected between a first reference potential point, for example the power supply voltage (−Vcc) terminal, and a second reference potential point, for example ground. These setting stages 32 function to average out the level of the FM noise generated inside the FM modulator circuit 22, and to set this average FM noise level as a fixed value. This is further explained below.

The level-subtraction stage 34 comprises a first inverting amplifier 40 to which is input the output signal S1 from the speech processing circuit 100, a first offset voltage regulator and half-wave rectifier circuit 42 and a second offset voltage regulator and half-wave rectifier circuit 44 to which, respectively, is input the output signal S2 from the first inverting amplifier 40, an inverting adder circuit 46 to which are input the output signals S3 and S4, respectively, from the circuits 42 and 44, and a second inverting amplifier circuit 48 to which is input the output signal S5 from the inverting adder circuit 46 and from which is supplied an output signal S6 for the FM modulator circuit 22 in the next stage.

The first inverting amplifier 40 comprises an operational amplifier op 1, a resistor R1 connected between one input terminal (terminal) of the operational amplifier and the output terminal of the LPF 110 in the speech processing circuit 100, a resistor R2 connected between the said −terminal and the output terminal of the operational amplifier, and a resistor R3 connected between one of the input terminals (+terminal) of the operational amplifier and ground.

The first offset voltage regulator and half-wave rectifier circuit (hereinafter referred to simply as the first circuit) 42 comprises an operational amplifier op 2, a resistor R4 connected between the output terminal of the operational amplifier op 1 and one of the input terminals (−terminal) of the operational amplifier op 2, a resistor R5 connected between a movable terminal (movable contact) in the first variable resistor VR 1 and one of the input terminals (−terminal) of the operational amplifier op 2, a diode D1 the anode of which is connected to one of the input terminals (−terminal) of the operational amplifier op 2 and the cathode of which is connected to the output terminal of the operational amplifier op 2, a series circuit between a diode D2 and a resistor R6 connected in parallel with the diode D1, and a resistor R7 connected between one of the input terminals (+terminal) of the operational amplifier op 2 and ground. The anode of the diode D2 is connected to the output terminal of the operational amplifier op 2 and the cathode thereof is connected to the resistor R6.

The second offset voltage regulator and half-wave rectifier circuit (hereinafter referred to simply as the second circuit) 44 comprises an operational amplifier op 3, a resistor R8 connected between the output terminal of the operational amplifier op 1 and one of the input terminals (−terminal) of the operational amplifier op 3, a resistor R9 connected between a movable terminal (movable contact) in the second variable resistor VR 2 and one of the input terminals (terminal) of the operational amplifier op 3, a diode D3 the anode of which is connected to one of the input terminals (−terminal) of the operational amplifier op 3 and the cathode of which is connected to the output terminal of the operational amplifier op 3, a series circuit between a diode D4 and a resistor R10 connected in parallel with the diode D3, and a resistor R11 connected between one of the input terminals (+terminal) of the operational amplifier op 3 and ground. The cathode of the diode D4 is connected to the output terminal of op 3 and the anode thereof is connected to the resistor R10.

The inverting adder circuit 46 comprises an operational amplifier op 4, a resistor R12 connected between the anode of the diode D4 and one of the input terminals (−terminal) of the operational amplifier op 4, a resistor R13 connected between the cathode of the diode D2 and one of the input terminals (−terminal) of the operational amplifier op 4, a resistor R14 connected between one of the input terminals (−terminal) of the operational amplifier op 4 and the output terminal thereof, and a resistor R15 connected between one of the input terminals (+terminal) of the operational amplifier op 4 and ground.

The inverting amplifier 48 comprises an operational amplifier op 5, a resistor R16 connected between the output terminal of the operational amplifier op 4 and one of the input terminals (−terminal) of the operational amplifier op 5, a resistor R17 connected between one of the input terminals (−terminal) of the operational amplifier op 5 and the output terminal thereof, and a resistor R18 connected between one of the input terminals (+terminal) of the operational amplifier op 4 and ground.

An example operation of the level-subtraction circuit 30 is now described. Let it be assumed here that, in the average FM noise level setting stage 32, the voltage on the movable terminal in the variable resistor VR 1 is set, as the average noise level, to a positive first voltage value (+Esn), and that the voltage on the movable terminal of the variable resistor VR 2 is set, as the average noise level, to a negative second voltage value (−Esn). Under these conditions, when the speech-processed voice signal from the LPF 110 is input as the input signal S1 (cf. FIG. 4(A)) to the level-subtraction stage 34 in the level-subtraction circuit 30, this signal S1 is inverse-amplified and amplitude-regulated by the inverting amplifier 40 that functions as a buffer, and is output as the signal S2 (FIG. 4(B)). This signal S2 is input to the first circuit 42 and the second circuit 44, respectively.

In the first circuit 42, by inverse-adding the aforementioned first voltage, that is, the +Esn voltage corresponding to the +side average FM noise level, to the input signal S2, the DC offset level is changed. From the signals for which this offset level has been changed, due to the action of the diodes D1 and D2, only the +side of the signal is output, as a positive-polarity signal S3 (FIG. 4(C)). Accordingly, signal components at levels at or below this average FM noise level (+Esn) will not be output, and only those signal components exceeding +Esn will be output.

Similarly, in the second circuit 44, signal components at levels at or below the average FM noise level (−Esn) will not be output, and only those signal components exceeding −Esn will be output. In other words, after the aforementioned second voltage, that is, the −Esn voltage, has been inverse-added to the input signal S2, corresponding to the −side average FM noise level, out of those signals, due to the action of the diodes D3 and D4, only the −side signals are output, as a negative-polarity signal S4 (FIG. 4(D)).

In this manner, +side and −side signals S3 and S4 are obtained from which the average FM noise level |Esn| has been subtracted. These signals S3 and S4 are input to the inverting adder circuit 46, where they are added and output as a combined output signal S5 (FIG. 4(E)). This combined output signal S5 is 180° out of phase with the initial input signal S1. Therefore the combined output signal S5 is input to the second inverting amplifier 48 where it is inverse-amplified and output as an output signal S6 the polarity of which agrees with the input signal S1 (FIG. 4(F)). The second inverting amplifier 48, moreover, can also regulate the level of signals passed to the FM modulator circuit 22.

This level-regulated output signal S6, then, is the modulating signal that is supplied to the FM modulator circuit 22.

Figure 5:
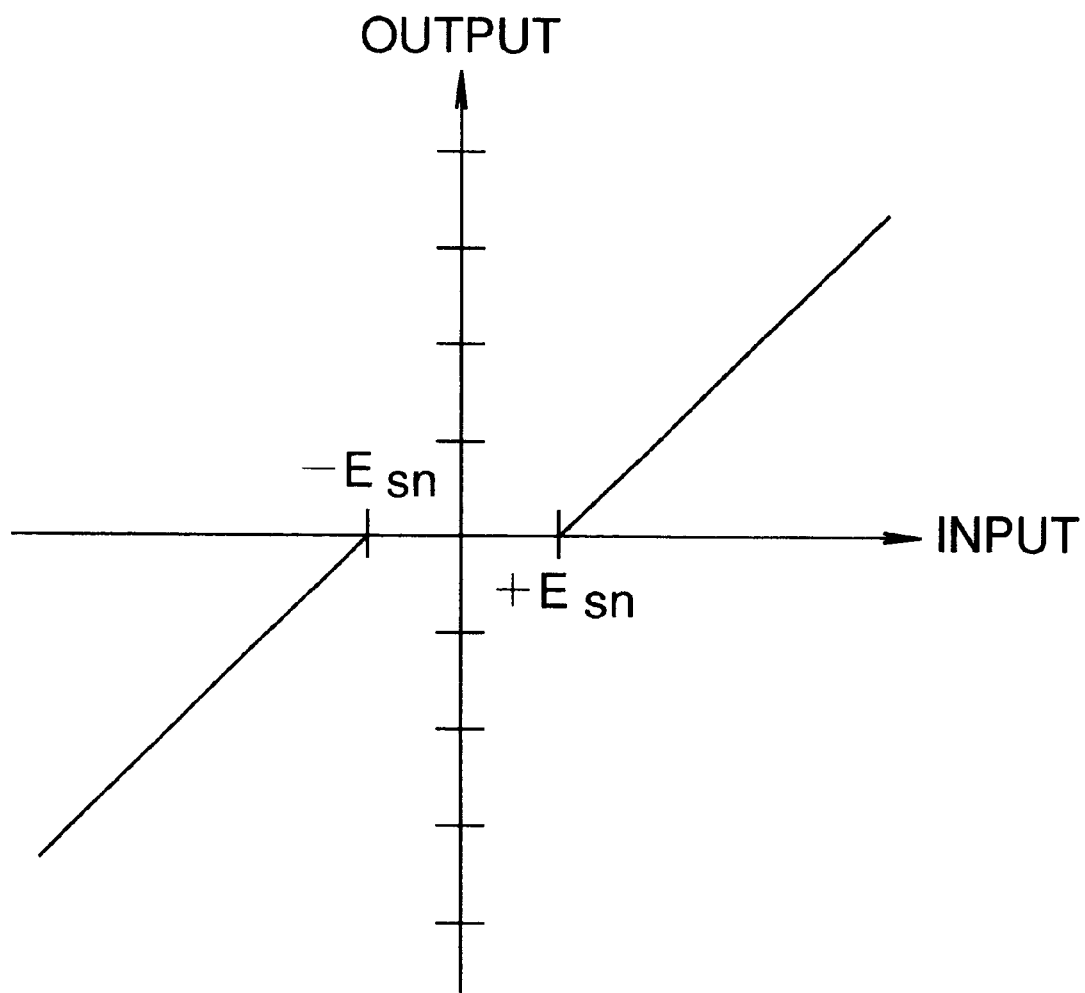
FIG. 5 is a characteristic diagram used in describing the input/output characteristics of the level-subtraction circuit diagrammed in FIG. 3.

FIG. 5 is an input/output characteristic plot of the relationship between the input waveform and output waveform for the level-subtraction circuit 30 described in the foregoing, that is, the relationship between the input and output signals. According to these characteristics, the output waveforms after +and −side level regulation are both linearly dependent on variations in the input a signal waveform, as is evident. In this diagram, the −Esn and +Esn represent the −and +sides of the signal level of the average FM noise level. What is indicated, then, is that, if the input signal is within the range of ±Esn, no output signal S6 will be output.

The average FM noise level setting stage 32 diagrammed in FIG. 3 is next described. In this example configuration, this setting stage 32 comprises two variable resistors, namely VR 1 and VR 2. Herewith, the setting of the average FM noise level is done as follows. Multiple FM modulator circuit units are prepared beforehand, and the FM noise levels produced in each of these FM modulator circuits is measured. Then the average value of these measured FM noise levels is taken) and that average value is set with the variable resistors, respectively, as the average FM noise level. The FM noise levels in the FM modulator circuits may also be measured, respectively, as time averages. Or, alternatively, the average FM noise level may be measured with a single FM modulator circuit.

When the circuit configuration of this first embodiment, as described in the foregoing, is implemented, a level-subtraction circuit 30 is provided in the input stage of the FM modulator circuit 22, the average FM noise level component is subtracted from the speech-processed voice signal, and the level-regulated voice signal thus obtained is input as the modulating signal to the FM modulator circuit 22, thereby making it possible to improve the linearity of the FM modulation level of input signals at low modulation levels.

Figure 6:
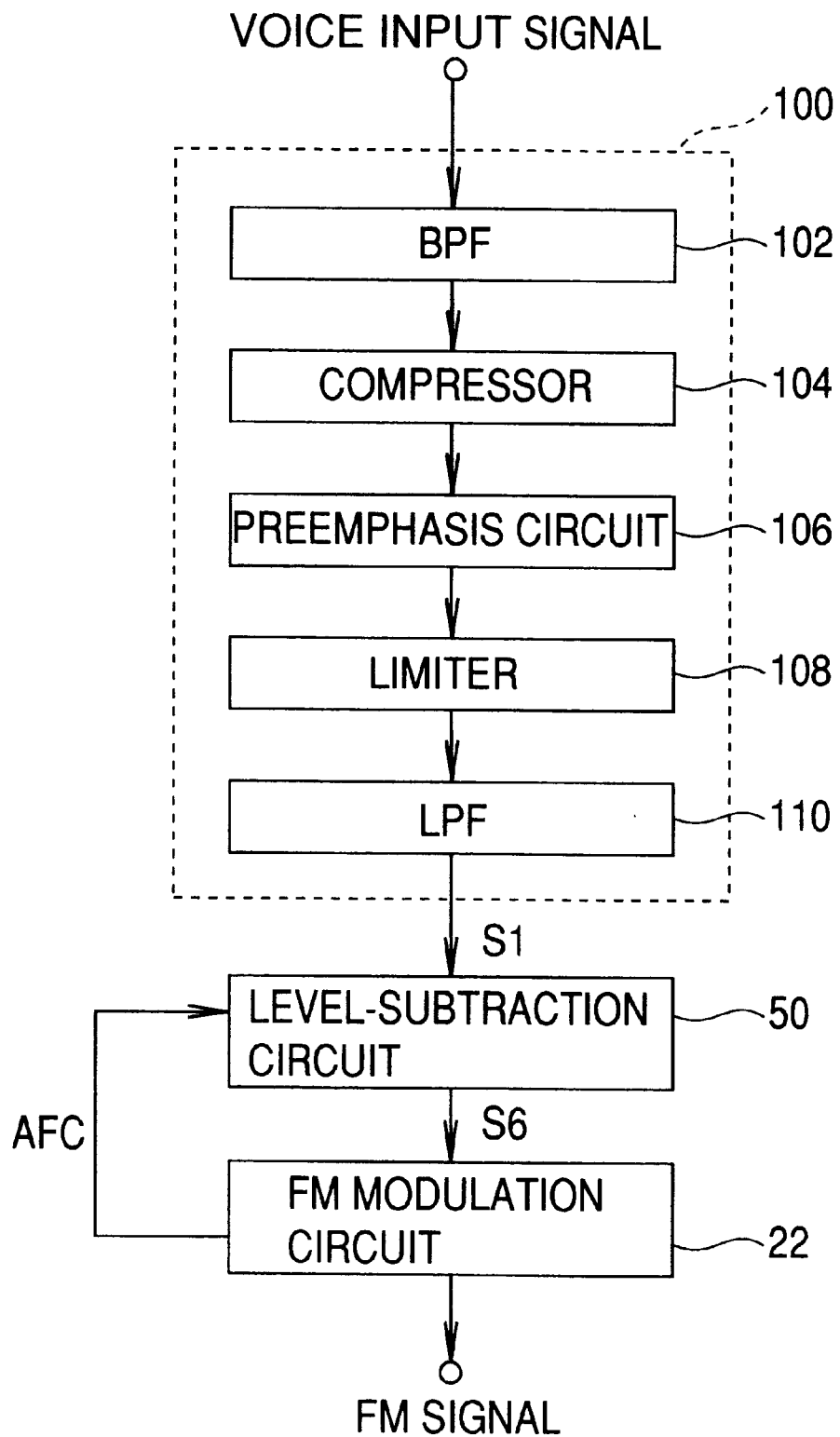
FIG. 6 is a block diagram of an example configuration of a transmitter, provided for describing a second embodiment of the frequency modulated signal transmitter of the present invention.
Figure 7:
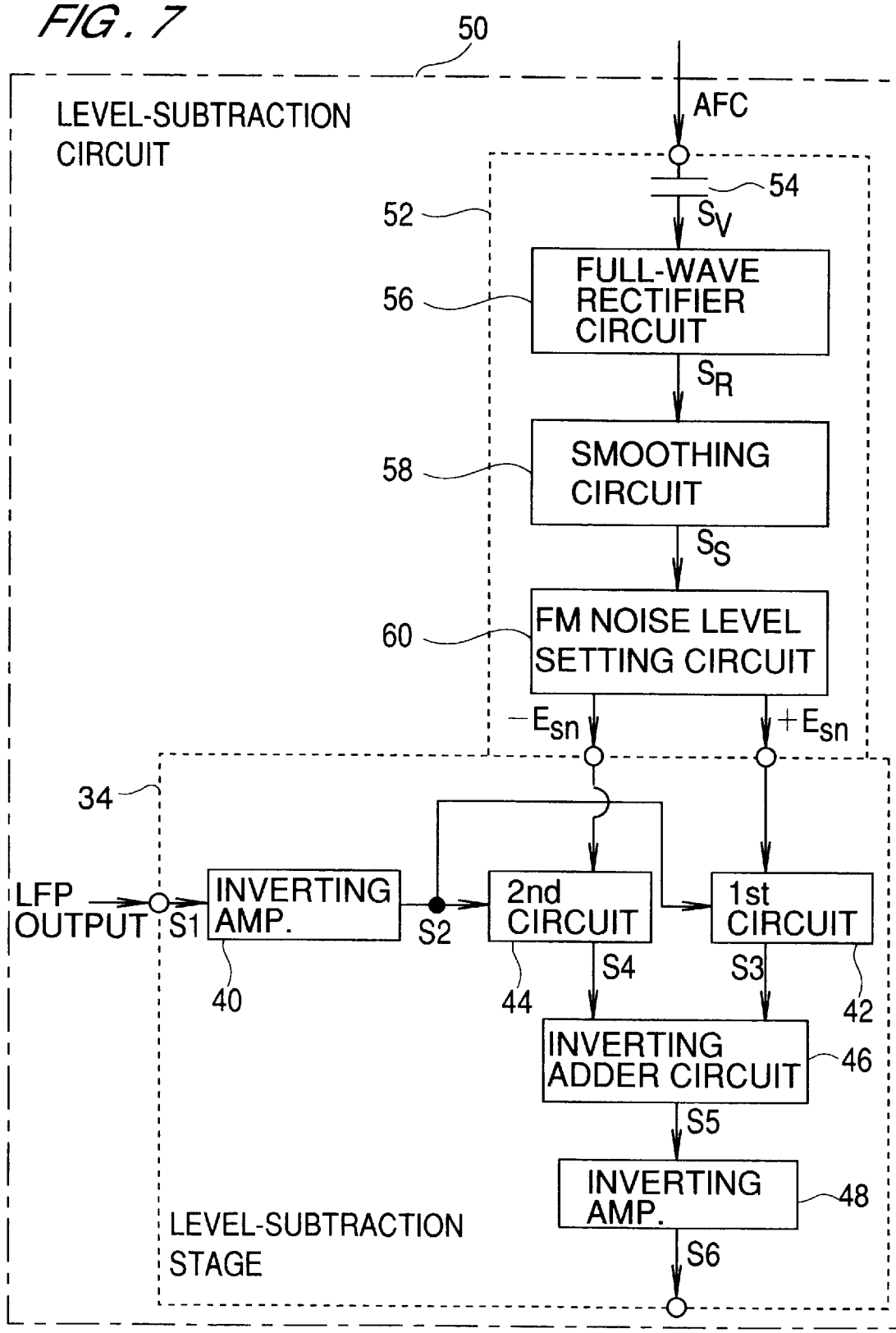
FIG. 7 is a block diagram of an example configuration of a preferred level-subtraction circuit for application in the transmitter diagrammed in FIG. 6.
Figure 8:
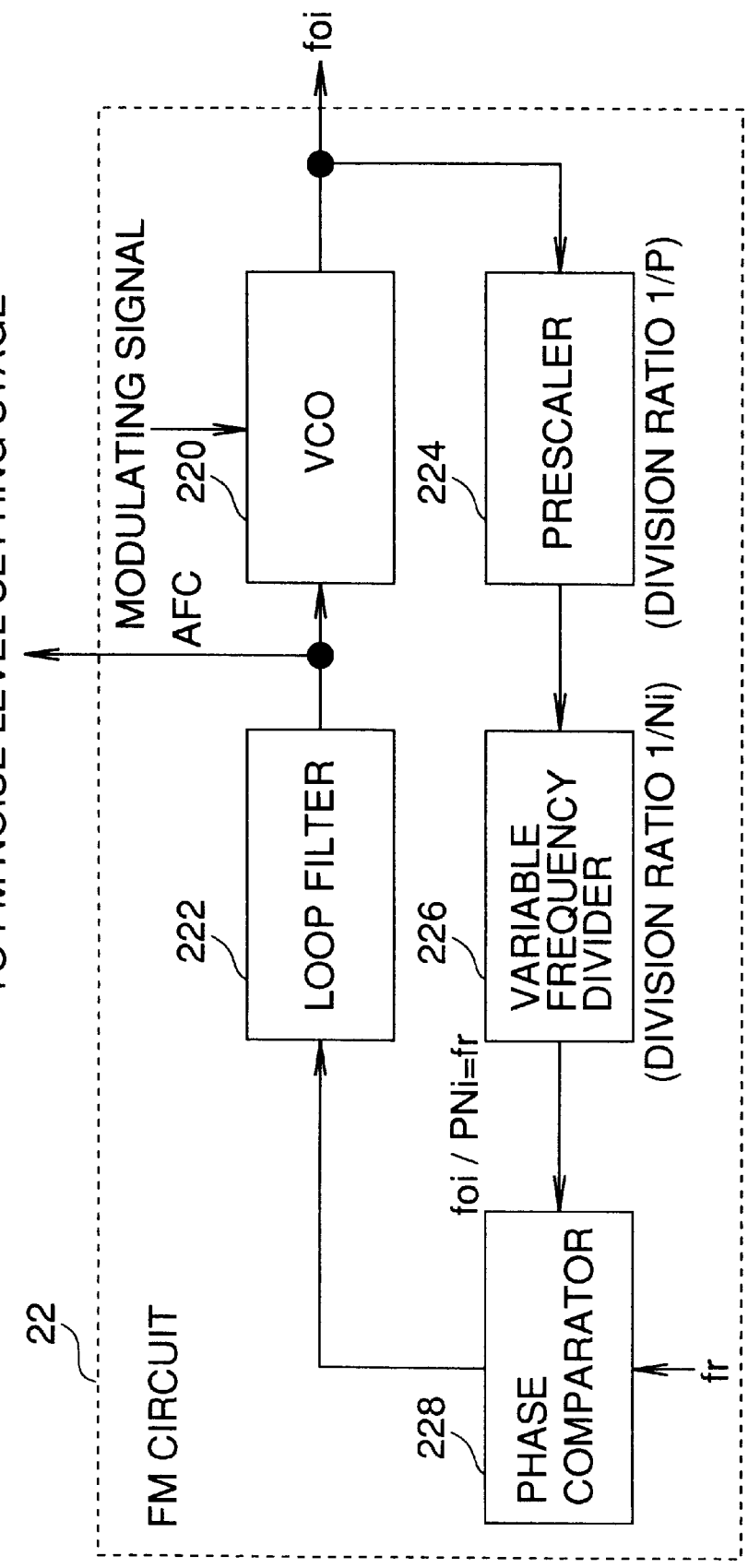
FIG. 8 is a block circuit diagram of an ordinary FM modulator circuit, provided for describing the present invention.

Next, a second embodiment of the frequency-modulated signal radio of the present invention is described, making reference to FIGS. 6, 7, and 8. FIG. 6 is a block circuit diagram corresponding to FIG. 1(B), which diagrams an example configuration of the second embodiment of the frequency-modulated signal radio of the present invention. FIG. 7 is a block circuit diagram of an example configuration of a level-subtraction circuit. And FIG. 8 is a block circuit diagram of an example configuration of a commonly used FM modulator circuit, provided for describing the present invention.

An example wherein a transmitter is configured with analog circuitry is described in conjunction with this second embodiment. The speech processing circuit and FM modulator circuit indicated in FIG. 6 are configured in the same way as the speech processing circuit and FM modulator circuit already described with reference to FIG. 2, and are assigned the same reference characters, so no further description of them is needed here. The level-subtraction circuit, however, is configured differently than the level-subtraction circuit 30 described in conjunction with FIG. 2. The level-subtraction circuit is assigned the reference character 50 in FIG. 6.

With this example configuration, the level-subtraction circuit 50 extracts the FM noise signal that is generated in the FM modulator circuit 22, and finds the average value thereof, by which means the average FM noise level subtracted from the voice input signal is automatically formed. The FM noise signal is now described.

The FM modulator circuit 22 ordinarily comprises circuitry in which a voltage controlled oscillator (VCO) 220 is employed. An example configuration is diagrammed in FIG. 8. In this example configuration, the band of a loop filter 222 is set at a signal band that is lower than the modulating signal input, the modulating signal is input to the VCO 220, and direct FM modulation is implemented. With this circuitry, the FM signal generated at the VCO 220, that is, the FM modulation wave (foi), is divided at a constant division ratio 1/P (where P is any suitable integer) by a prescaler 224, and then further divided to the same frequency as a reference frequency by a variable frequency divider 226 (at a division ratio of 1/Ni, for example, where Ni is any suitable integer), and then input to a phase comparator 228. In the phase comparator 228, the reference frequency signal is supplied, so this reference frequency and the frequency of the signal from the variable frequency divider 226 are compared. The results of this comparison are sent as a comparison output to the loop filter 222. In the loop filter 222, the unneeded high-frequency components and noise components contained in the comparison output are removed, and the resulting signal is output as an AFC output signal to the VCO 220. Accordingly, this AFC output signal becomes the AFC voltage that controls the oscillation frequency of the VCO.

It is a known fact, incidentally, that the stability of the oscillation frequency of this VCO 220 (i.e. the stability of the PLL response characteristics and periodic characteristics) are influenced by the characteristics of the loop filter.

Now, the oscillation frequency of the VCO 220 will fluctuate due to the modulating signal and the control signal from the loop filter 222, so it is necessary to continually control the VCO 220 to keep the input signal to the phase comparator 228 in line with the reference frequency fr. When the frequency that is 1/(PNi) of the VCO frequency and the reference frequency of the phase comparator are different, the needed control voltage for making the frequencies agree is the comparison output generated as the phase difference compensation from the phase comparator 228, so the oscillation frequency of the VCO 220 is controlled by this comparison output. The frequency of the FM modulation wave (frequency modulated signal) will vary instantaneously according to the modulating signal, so the filter 222 is used to remove the instantaneous phase differences with the reference frequency and the higher harmonic components generated from the phase comparator 228. The output from the phase comparator 228 is input to this loop filter 222, the average phase difference component is removed from the comparison output, and the resulting control signal is sent to the VCO 220. The VCO is controlled by this control signal (AFC output signal).

However, the bandwidth of this loop filter 222 cannot be made extremely narrow because of the limitations of the frequency lead-in range and synchronous lead-in time, etc. For this reason, phase differences that cannot be removed by the loop filter 222 will be generated in the FM modulator circuit and the AFC output signal will fluctuate.

It is necessary to minimize the effects of this fluctuation in the AFC output signal from the FM modulator circuit 22 on the FM modulating signal. In the present invention, therefore, as has been explained already, an average FM noise level is set from the FM noise generated in the FM modulator circuit 22, the voltage component of this average FM noise level is stripped from the voice input signal, a level-regulated voice signal is generated, and FM modulation is performed with this level-regulated voice signal.

Figure 9A:
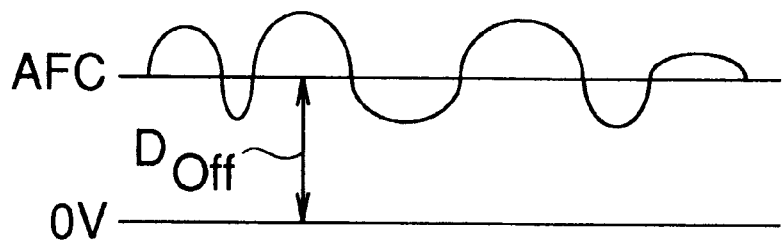
FIGS. 9(A)–9(D) are signal waveform diagrams used in describing an average FM noise level setting stage for configuring the level-subtraction circuit.
Figure 9B:
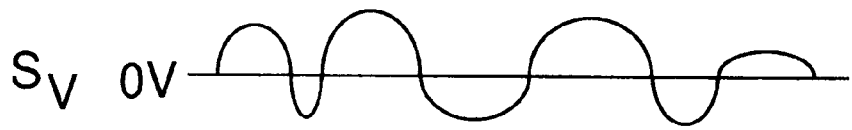
Figure 9C:
Figure 9D:
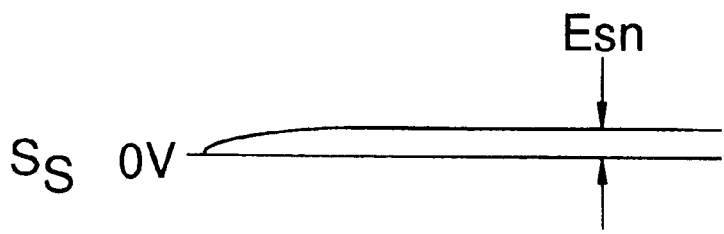

The setting operation for this average FM noise level is now described with reference to FIGS. 7, 9, and 10. In order to extract the FM noise signal, an FM noise extraction circuit is provided in the average FM noise level setting stage 52. This FM noise extraction circuit comprises a capacitor 54. One of the terminals of this capacitor 54 is connected to the AFC signal terminal of the VCO of the FM modulator circuit 22. The AFC output signal is split and supplied to the average FM noise level setting stage 52 from the FM modulator circuit 22 through this capacitor 54. This AFC output signal (noted as AFC in FIG. 7) is the signal resulting from the fluctuation caused by the FM noise being superimposed on the DC offset component (noted as Doff in FIG. 9), the waveform of which is represented in FIG. 9(A). The capacitor 54 removes the DC component Doff from the AFC output signal, yielding a fluctuation component signal (noted by Sv in FIG. 9(B)). This fluctuation signal is input as an input signal to the full-wave rectifier circuit 56 where it is rectified. The rectified noise signal obtained as a result of this full-wave rectification is noted as $S_R$ in FIG. 9(C). This signal is then input as the input signal to a smoothing circuit 58 in the next stage. This smoothing circuit 58 subjects the input signal to an ordinary smoothing process, and extracts the output signal (noted as Ss in FIG. 9(D)) of the averaged FM noise level Esn. This average FM noise level signal Ss is supplied in the next stage to an FM noise voltage setting circuit 60. In this setting circuit 60, from the average FM noise level Esn, the +and −side average FM noise levels +Esn and −Esn are set, respectively, in order to be subtracted by the level-subtraction stage in the next stage.

Figure 10:
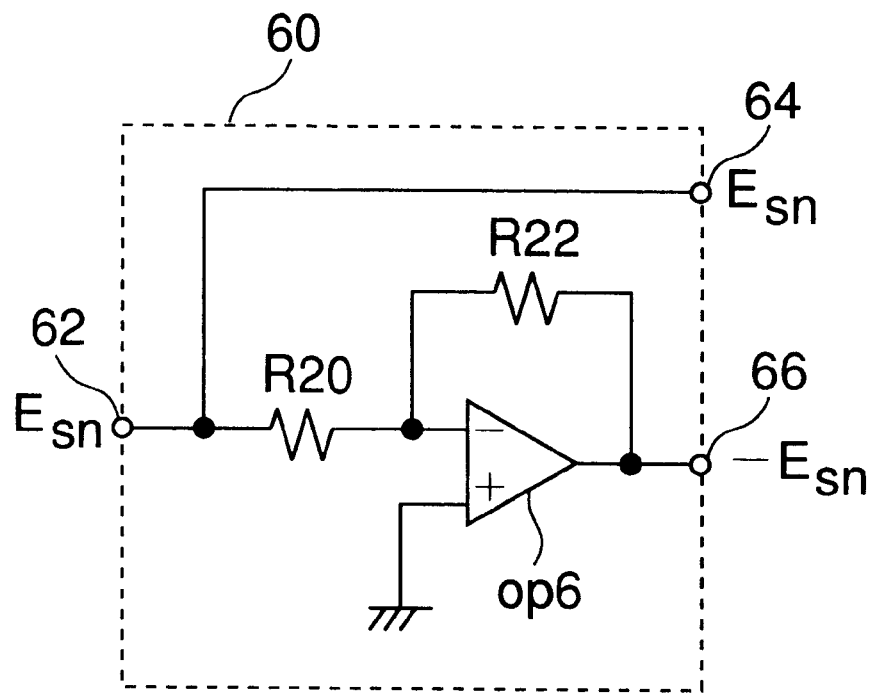
FIG. 10 is a circuit configuration diagram of an example configuration of an FM noise voltage setting circuit for configuring an average FM noise level setting stage.

One example of the circuitry in this average FM noise voltage setting circuit 60 is diagrammed in FIG. 10. This circuit 60 can be configured as an inverting amplifier using an operational amplifier op 6. Here, for example, the output terminal of the smoothing circuit 58 is made the input terminal 62, a first resistor R20 is connected between this input terminal 62 and the −terminal of op 6, a second resistor R22 is connected between this −terminal and the output terminal of op 6, and the +terminal of op 6 is connected to a ground potential point. Then, using the output terminal of the smoothing circuit 58, without alteration, for the +Esn first output terminal, the output terminal of op 6 is used as the −Esn second output terminal.

By implementing the average FM noise voltage level setting stage 52 as configured in FIG. 7, the AFC output signal is extracted from the FM modulator circuit 22, the DC component is removed from this AFC output signal to obtain an average AC component, and the average FM noise level Esn is determined from this average AC component. Therefore, when the amplitude of fluctuation in the average voltage of the AFC output signal varies, the average FM noise level will follow that variation and automatically fluctuate itself.

The operation of the radio transmitter of the present invention, equipped with the circuitry described in conjunction with FIGS. 6, 7, and 10, will now be described. As in the first embodiment, the needed signal frequency components are extracted from the voice input signal by the BPF 102. This signal constituted by the extracted frequency components is compressed with a 2:1 compression ratio relative to a designated reference value in the compressor 104. The gain of this compressed signal is then attenuated on the low-level side and elevated on the high-level side in the preemphasis circuit 106. Let it be assumed here, for example, that the attenuation and elevation ratio, referenced to the designated frequency, is 6 dB/oct. This gain-adjusted signal is then subjected to level limitation in the limiter 108, so that no output signals above a certain level are output from the limiter 108. The signal from the limiter 108 is passed through the LPF 110, where unneeded harmonic wave components are removed, and output.

In the level-subtraction circuit 50, as described earlier, only the average FM noise level (+Esn) is subtracted from the signal output by the LPF 110, and the resulting signal is supplied to the FM modulator circuit 22 in the next stage. The circuitry of the level-subtraction stage 34 in the level-subtraction circuit 50 is configured the same as the level-subtraction stage described already with reference to FIG. 3, and it functions in the same way. In FIG. 7, therefore, the configuring elements thereof are indicated in block diagram form without representing the structural details.

With this example configuration, in the first circuit 42, the +side average FM noise level (+Esn) set in the level-subtraction circuit is set as the first voltage, while, in the second circuit 44, the −side average FM noise level (−Esn) is set as the second voltage. When the input signal S1 (cf. FIG. 4(A)) is input to the inverting amplifier 40 in the level-subtraction stage 34 from the LPF 110, the output signal S2 (FIG. 4(B)), with inverted polarity, is input to the first and second circuits 42 and 44.

In the first circuit 42, the average FM noise level +Esn is added to the signal S2, and the DC offset level of the signal S2 is changed. From this first circuit 42, then, signal components at or below the average FM noise level +Esn will not be output, and only signal components exceeding that level will be output as the output signal S3 (FIG. 4(C)). Meanwhile, in the second circuit 44, the average FM noise level −Esn is added to the signal S2, changing the DC offset of the signal S2. And from this second circuit 44, only those signal components exceeding −Esn will be output as the output signal S4 (FIG. 4(D)).

These two output signals S3 and S4 are supplied to the inverting adder circuit 46. After being inverted in the inverting adder circuit 46, the two signals are combined and output as the output signal S5 (FIG. 4(E)). This output signal S5 is sent to the inverting amplifier 48 where it is inverse-amplified to yield the output signal S6 (FIG. 4(F)). This output signal has had the average FM noise level signal components within the range of +Esn and −Esn subtracted from it, and exhibits a polarity that coincides with the input signal S1. This output signal S6 of the level-subtraction circuit 50 is a level-regulated voice signal. This signal S6 is output as the modulating signal fed to the FM modulator circuit 22.

Thus, in the example configuration of the second embodiment also, as described in the foregoing, a level-subtraction circuit 50 is provided in the input stage of the FM modulator circuit 22 for subtracting the average FM noise levels (±Esn), by which means the linearity of the input signal at low modulation levels relative to the level of FM modulation can be improved. Additionally, with this embodiment, based on the AFC output signal, optimal threshold values are dynamically set for the individual average FM noise level in the FM modulator circuit 22, so that improved linearity can be expected with this second embodiment, as with the first embodiment.

Figure 11:
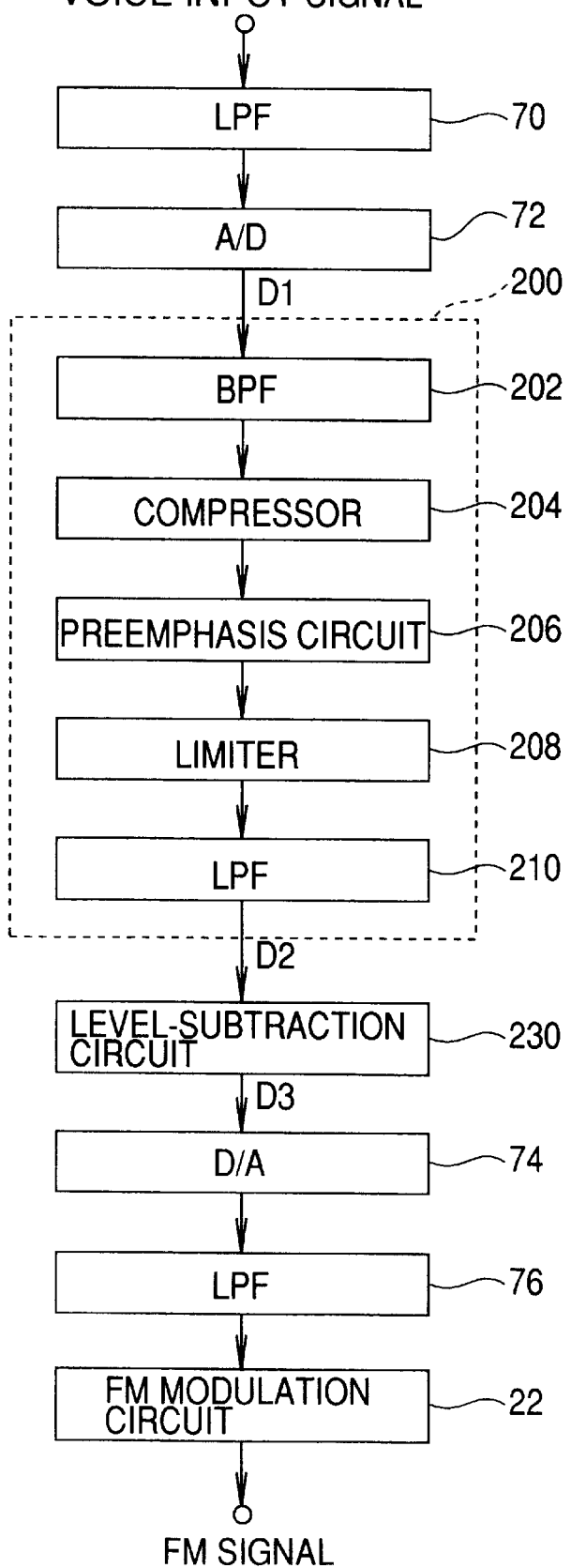
FIG. 11 is a block diagram of an example configuration of a transmitter, provided for describing a third embodiment of the frequency modulated signal transmitter of the present invention.
Figure 12:
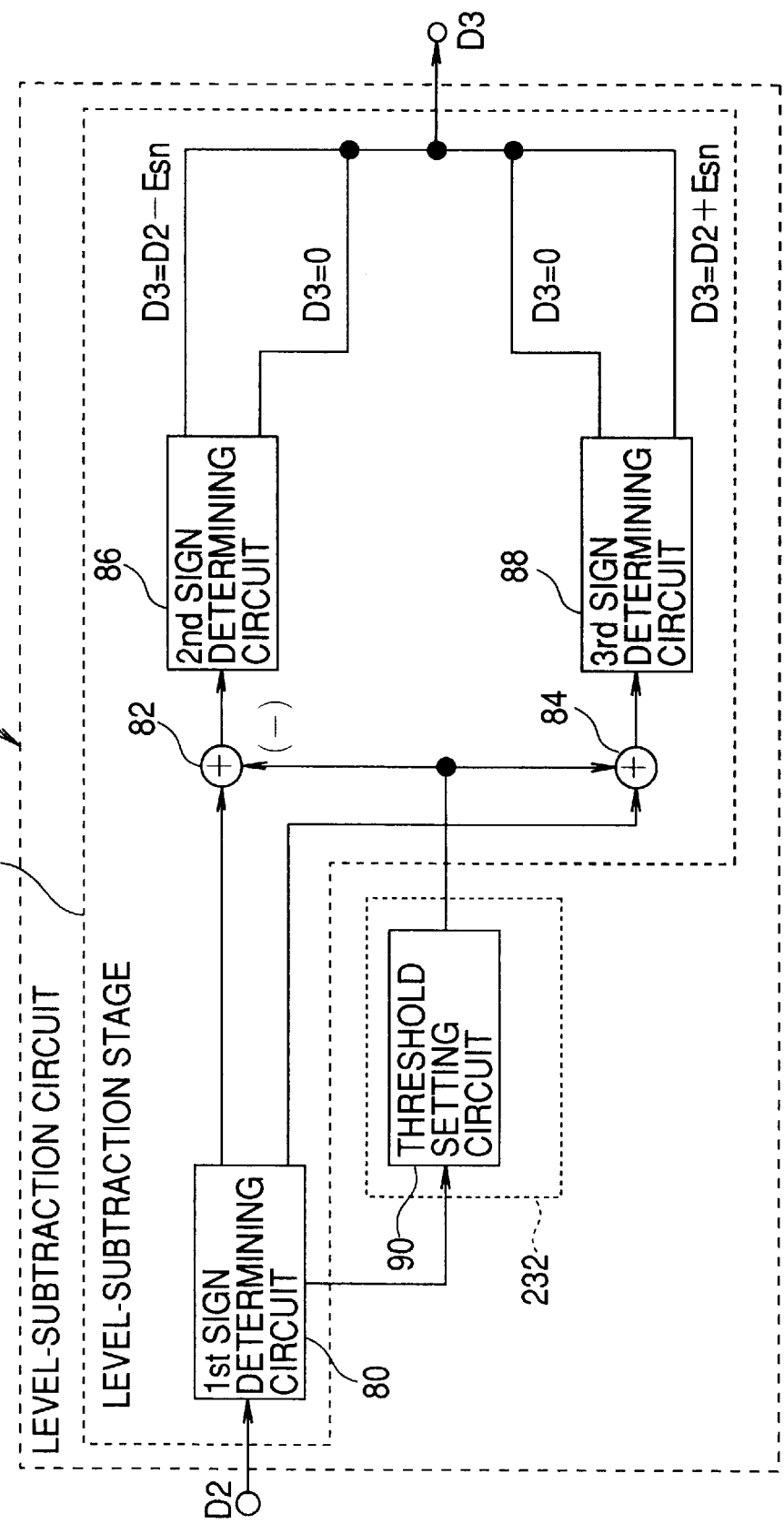
FIG. 12 is a block diagram of an example configuration of a preferred level-subtraction circuit for application in the transmitter diagrammed in FIG. 11.

An example configuration of a third embodiment of the radio transmitter of the present invention, configured with digital processing circuitry, is next described, making reference to FIGS. 11 and 12.

In this example, the configuration comprised corresponds to FIG. 1(A). Of the configuring components diagrammed in FIG. 11, the speech processing circuit, level-subtraction circuit, and FM modulator circuit have the same functions as the speech processing circuit 100, level-subtraction circuit 30, and FM modulator circuit 22 that are configuring components described in conjunction with FIG. 2. In the example configuration diagrammed in FIG. 11, however, the speech processing circuit, level-subtraction circuit, and FM modulator circuit are each made up of digital processing circuits, and so are described using different reference characters. In order to implement various kinds of controls on the digital processing in this transmitter, moreover, such as controlling the timing of the various components, for example, a controller such as a so-called CPU is provided, but this CPU is omitted from the drawings.

Here, as part of the radio transmitter, an LPF 70 connected to the voice input terminal, and an analog/digital (A/D) converter 72 connected between the LPF 70 and a BPF 202, are provided in the stage before the speech processing circuit 200. Also provided are a D/A converter 74 connected to the level-subtraction circuit 230, and an LPF 76 connected between the D/A converter 74 and the FM modulator circuit 22. These components, namely the speech processing circuit 200, LPF 70, A/D converter 72, D/A converter 74, and LPF 76, can all be configured in digital circuitry using the prior art.

In the configuration diagrammed in FIG. 11, the voice input signal is input to the LPF 70 where the high-level components outside the voice band are cut, and then, in the A/D converter 72, the signal is A/D converted with a sampling period that is able to thoroughly cover the voice band to be transmitted. The digital voice input signal D1 thus obtained normally has a plus or minus sign noted on the MSB side, as is commonly known. As is also commonly known, this sign is always attached to a digital signal during digital processing. This input voice signal D1 passes sequentially through the BPF 202, compressor 204, preemphasis circuit 206, limiter 208, and LPF 210, resulting in a digitally speech-processed signal which here becomes the digital output signal D2. The digital output signal D2 from this speech processing circuit 200 is input to the level-subtraction circuit 230.

This digital output signal D2 is expressed as digital values representing numerical values within the range of +32767 to −32767, represented as the two's complement configured in 16 bits. When the analog voice signal has a positive polarity, the resulting digital signal has a numerical value of from +32767 down to 0. When the analog voice signal has a negative polarity, the resulting digital signal has a numerical value of from −32768 to −1. In the case of two's complement expression, the signs representing the polarity of these digital signals are the plus and minus signs "0" and "1" on the MSB side.

Figure 13:
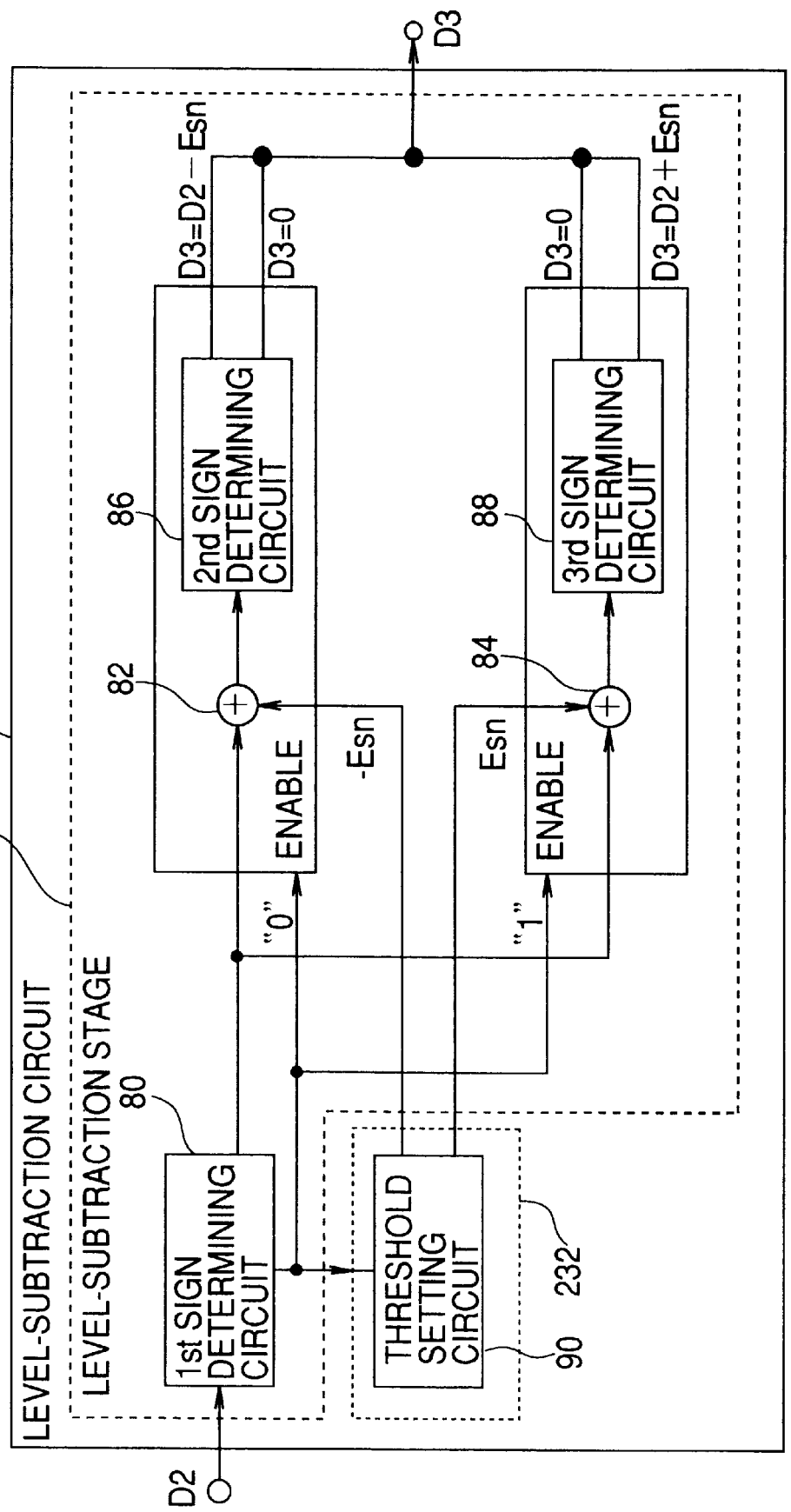
FIG. 13 is a more detailed block diagram of the level-subtraction circuit diagrammed in FIG. 12.
Figure 14:
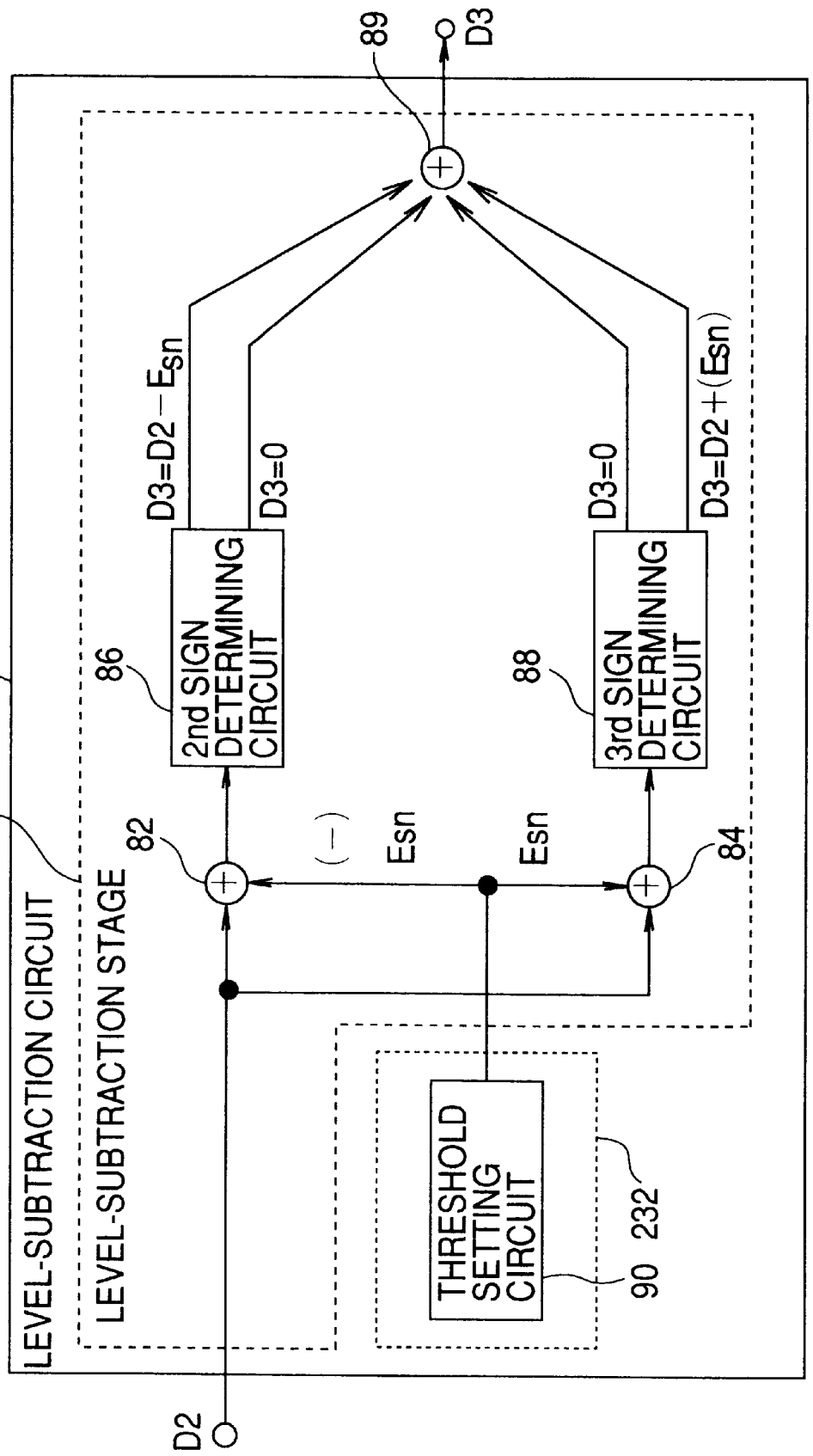
FIG. 14 is a block diagram of another example configuration of a level-subtraction circuit.

The level-subtraction circuit 230, in one example, is formed as a digital circuit configured as diagrammed in FIGS. 12, 13, or 14. This circuit 230, as described earlier, comprises an average FM noise level setting stage 232 and a level-subtraction stage 234.

In the example configuration diagrammed in FIG. 12, the level-subtraction stage 234 comprises a first sign determining circuit 80 connected to the LPF 210 of the speech processing circuit 200, a first adder circuit 82, the first input terminal of which is connected to the positive determining output terminal of the first sign determining circuit 80, a second adder circuit 84, the first input terminal of which is connected to the negative determining output terminal of the first sign determining circuit 80, a second sign determining circuit 86 to which the output terminal of the first adder circuit 82 is connected, and a third sign determining circuit 88 to which the output terminal of the second adder circuit 84 is connected. Meanwhile, the average FM noise level setting stage 232 comprises a threshold setting circuit 90 that determines the threshold value as the average FM noise level. The output terminal of this threshold setting circuit 90 is connected to the second input terminals of the first and second adder circuits 82 and 84.

With this example configuration, the first sign determining circuit 80 comprises an accumulator (not shown). The second sign determining circuit 86 and the third sign determining circuit 88, respectively, comprise an accumulator and a register (not shown). Alternatively, one common register may be used. Or, instead of incorporating the register or registers in the second and third sign determining circuits 86 and 88, it or they may be provided separately from these circuits.

Furthermore, as is commonly known, when a digital value is input to an accumulator as a digital signal, the sign of that digital value is determined. In determining whether this digital value is positive or negative, when the sign of the digital value is "1," that value is determined to be "negative," and when it is "0," it is determined to be "positive." In other words, the configuration here is such that, if the sign bit of the digital signal is "1," that signal is judged to be a negative value, and if it is "0," then that signal is judged to be a positive signal.

The threshold setting circuit 90 sets the first and second voltages, which is to say the average FM noise levels (+Esn), as digital values. For this purpose, the average FM noise level is determined from the FM noise levels generated in the FM modulator circuit 22 by some appropriate means, and that average value is determined in the threshold setting circuit 90 as a digital value converted at the input signal level. This determination may be made using, for example, means such as those already described in connection with the first embodiment. The average FM noise level thus found is stored as a threshold value in a memory in the threshold setting circuit 90 so that it can be read out freely. It may be written into a data ROM, for example, or written to a RAM from a controller such as a CPU.

A description is given here for an example wherein the average FM noise level is set as a threshold value in the threshold setting circuit 90. Let it be assumed that the FM modulator circuit's modulation sensitivity is 15 Hz/mV for an average FM noise frequency found from a plurality of FM modulator circuits, and that the average FM noise frequency at this time is 60 Hz. Then 60 Hz/(15 Hz/ mV)=4 mV, so a digital value corresponding to this 4 mV is stored as the threshold value in the threshold setting circuit 90.

Alternatively, the threshold value may be determined and set as follows. Let it be assumed that the reference modulating signal is 1 kHz, the maximum frequency deviation is ±12 kHz, and the digital value corresponding to ±800 mV is +4096 (12-bit equivalent). The voltage resolution per bit in this case is 800 mV/4096 bits=approximately 0.1953 mV/bit. Converting this to a frequency deviation value, we get 12 kHz/4096 bits=approximately 2.93 Hz/bit. Now, assuming that the average FM noise is 60 Hz, the value that must be stored in the threshold setting circuit 90 is then 60 Hz/2.93=approximately 20.47. Accordingly, a digital value of "20" is stored in the threshold setting circuit 90.

The operation of the level-subtraction circuit 230 is next described. When a speech-processed digital signal (data) from the voice signal processor 200 is input to the accumulator in the first sign determining circuit 80, the polarity of this signal is determined. Based on this determination, the digital signal in the accumulator, as either a positive or negative digital value, is discriminated as such and output to the corresponding output terminal, either positive or negative. In response to this polarity determination, moreover, a digital value is supplied from the threshold setting circuit 90, either to the first adder circuit 82 indicating a −Esn value, or to the second adder circuit 84 indicating a +Esn value. Accordingly, when a positive digital value (positive-polarity speech-processed signal) is sent to the first adder circuit 82, this positive digital value and the average FM noise level (−Esn) are added in that adder circuit 82, and digitally output to the second sign determining circuit 86.

In this second sign determining circuit 86, the results of subtracting the positive digital value and the average FM noise level, that is, the first added value, is input to the accumulator. The polarity of this first added value (digital value) input to the accumulator is determined. If that determination is negative, then, with the results of this negative determination, the register is accessed and the data having an output level of "0" stored in the register are sent to the output terminal of the level-subtraction circuit 230 as a digital output signal D3. This means that the size of the positive-polarity analog voice input signal level is smaller than the size of the average FM noise level +Esn. Contrariwise, if the digital value in the accumulator is judged to be positive in circuit 86, then the results of adding the positive digital value and the average FM noise level (−Esn) will be sent, without alteration, as the output signal D3 to the output terminal of the level-subtraction circuit 230. In other words, this output signal D3=D2−Esn. This means that the size of the positive-polarity analog voice input signal level is larger than the size of the average FM noise level +Esn, that is, that the output signal is a signal in which the average FM noise level has been stripped from the voice signal component.

On the other hand, in the first determining circuit 80, if the digital value in the accumulator is determined to be negative, that negative digital value (negative-polarity speech-processed signal) is sent to the second adder circuit 84. In the second adder circuit 84, the negative digital value and the average FM noise level +Esn are added and the resulting digital value is output as a second added value to the third sign determining circuit 88.

In the third sign determining circuit 88, the results of subtracting the negative digital value and the average FM noise level, that is, the second added value (digital value), is input to the accumulator. When the sign of the digital data in the accumulator is determined, if that result is positive, the register is accessed and data having an output level of "0" stored in the register are sent as digital output signal D3 to the level-subtraction circuit 230. This means that the size of the negative-polarity analog voice input signal level is smaller than the size of the average FM noise level. If, however, the digital value in the accumulator is determined to be negative in the circuit 88, then the results of the addition of the digital value and the average FM noise level +Esn are sent, without alteration, as output signal D3 to the output terminal of the level-subtraction circuit 230. In other words, this output signal D3=D2+Esn. This means that the size of the negative-polarity analog voice input signal level is larger than the size of the average FM noise level −Esn, that is, that this output signal is a signal wherein the average FM noise level has been stripped from the voice signal component.

As explained earlier, the digital output signal D3 obtained by processing the speech-processed signal D2 in the level-subtraction circuit 230 is converted to an analog signal in the D/A converter 74 and then, after having the components outside of the voice band removed by the LPF 76, is sent to the FM modulator circuit 22. In the FM modulator circuit 22, this input signal is subjected to conventional analog processing and an FM signal is output.

In FIG. 13 is diagrammed a more explicit circuit configuration for the level-subtraction circuit 230 described with reference to FIG. 12. With the circuitry diagrammed in FIG. 13, a digital value, after its sign has been determined, is sent from the first sign determining circuit 80 to both the first and second adder circuits 82 and 84. At the same time, from the first sign determining circuit 80, the sign determination results are sent as a control signal to the threshold setting circuit 90. This control signal, when the determination result is negative, is sent as an enable signal to the first adder circuit 82 and the second sign determining circuit 86. When the determination result is positive, on the other hand, the control signal is sent as an enable signal to both the second adder circuit 84 and the third sign determining circuit 88.

Configured in this way, when it is determined in the first sign determining circuit 80 that the digital signal is positive, the positive signal value is sent to the first and second adder circuits 82 and 84. At the same time, the positive determination results are sent to the threshold setting circuit 90, and are also sent as enable signals to the second adder circuit 84 and the third sign determining circuit 88, temporarily prohibiting the functioning of both circuits. The average FM noise level (−Esn) is sent from the threshold setting circuit 90 to the first adder circuit 82. In the first adder circuit 82, the positive digital signal and −Esn are added and the result is sent to the second sign determining circuit 86. Subsequent signal processing is conducted in the same manner as described in conjunction with FIG. 12, resulting in the output of the digital signal D3, so no further description need be given here.

Similarly, when the digital signal is judged to be negative in the first sign determining circuit 80, the negative digital signal is sent to the second and the first adder circuits 84 and 82. At the same time, the negative determination results are sent to the threshold setting circuit 90 and as enable signals to both the first adder circuit 82 and the second sign determining circuit 86, temporarily prohibiting the functioning of those two circuits. The average FM noise level (Esn) is sent from the threshold setting circuit 90 to the second adder circuit 84, and the negative digital value and Esn are added and the result sent to the third sign determining circuit 88. Subsequent signal processing is done in the same manner as described in conjunction with FIG. 12, and the digital signal D3 is output, so no further description is given here.

The level-subtraction circuit 230 described with reference to FIGS. 12 and 13 comprises a first, second, and third sign determining circuit 80, 86, and 88, in a configuration wherein either the combination of the first adder circuit 82 and the second sign determining circuit 86, or the combination of the second adder circuit 84 and the third sign determining circuit 88 is active. Alternatively, it is possible to configure the circuit 230 so that both the combination of the first adder circuit 82 and the second sign determining circuit 86 and the combination of the second adder circuit 84 and the third sign determining circuit 88 are active simultaneously. This configuration of the circuit 230 is now described with reference to FIG. 14.

This level-subtraction circuit 230 is now configured so that the first sign determining circuit 80 is omitted, and the digital output signal D2 from the speech processing circuit 200 is sent directly to the first and second adder circuits 82 and 84. Also, the threshold setting circuit 90 is configured with a memory in which the average FM noise level (Esn) is stored so that it can always be output. In addition, a phase inverting circuit (noted by the symbol "-" in FIG. 14) is placed between the first adder circuit 82 and the threshold setting circuit 90. Further, a third adder circuit 89 is provided for adding all of the results output from the second and third sign determining circuits 86 and 88, and from which the output signal D3 is output.

Configured thusly, the digital output signal D2 from the speech processing circuit 200 is sent to the first and second adder circuits 82 and 84. Meanwhile, from the threshold setting circuit 90, Esn is sent to the first adder circuit 82 with the sign inverted, while Esn is sent to the second adder circuit 84 as is. Accordingly, in the first adder circuit 82, the signal D2 and the signal −Esn are added, and the resulting digital value of (D2−Esn) is sent to the second sign determining circuit 86 where its sign is determined. Meanwhile, in the second adder circuit 84, the signal D2 and the signal Esn are added, and the resulting digital value of (D2 +Esn) is sent to the third sign determining circuit 88 where its sign is determined.

The signal processing in the second and third sign determining circuits 86 and 88 is performed in the same manner as described with reference to FIGS. 12 and 13, so no detailed description is given here. From the circuit 86, when the determination is positive, D3=D2−Esn appears as the output signal D3, and when the determination is negative, D3=0 appears. Similarly, from the circuit 88, when the determination is positive, D3=0 appears as the output signal D3, and when it is negative, D3=D2+Esn appears. These results are added in the third adder circuit 89, and one of the three levels, namely D3=D2−Esn, D3=D2+Esn, and D3=0, is output as output signal D3 to the level-subtraction circuit 230.

The level-subtraction stage 234 in the level-subtraction circuit 230 described in the foregoing has been described as a hardware implementation, but it is also possible to implement the functions of this level-subtraction stage 234 in software.

In the radio transmitter of the example configuration of the third embodiment described in the foregoing, the level-subtraction circuit 230 that subtracts the average FM noise level (−Esn) is placed in the input stage of the FM modulator circuit 22, the average FM noise level component is stripped from the voice signal component in this circuit, and the level-reduced voice signal is input to the FM modulator circuit 22, so, in this transmitter also, an improvement can be realized in the linearity relative to the FM modulation level of an input signal at low modulation level.

Figure 15:
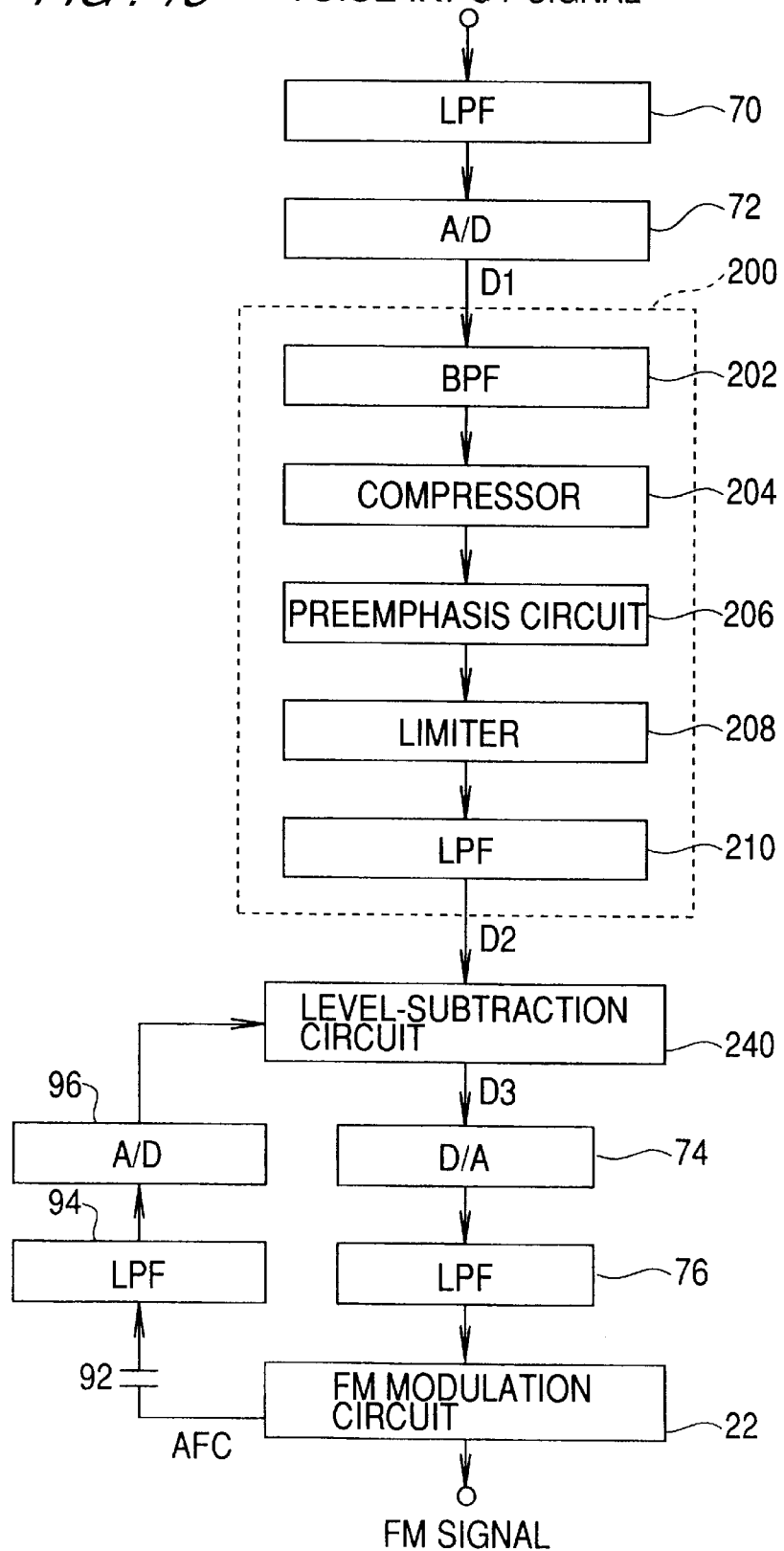
FIG. 15 is a block diagram of an example configuration of a transmitter, provided for describing a fourth embodiment of the frequency modulated signal transmitter of the present invention.
Figure 16:
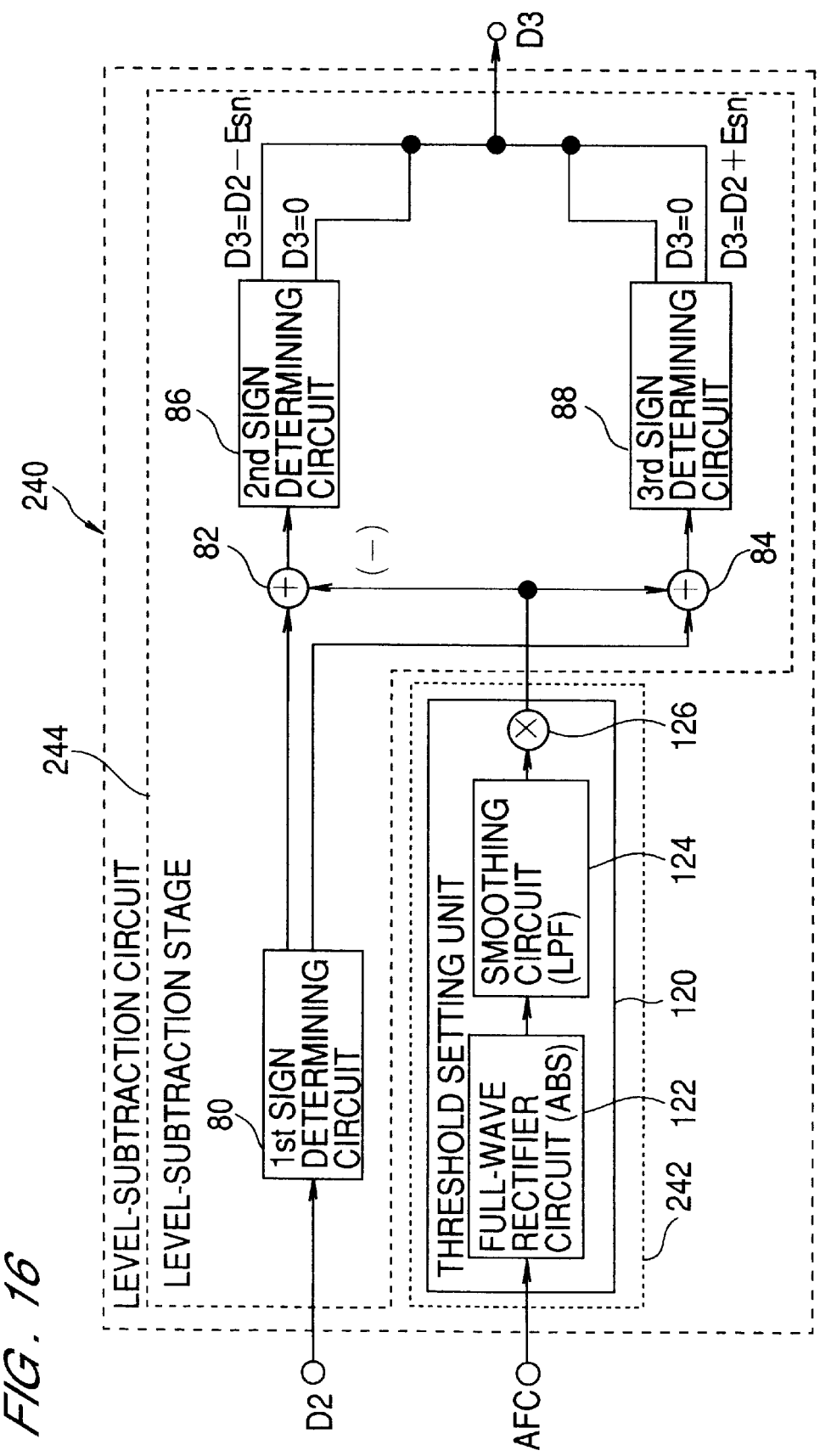
FIG. 16 is a block diagram of an example configuration of a preferred level-subtraction circuit for application in the transmitter diagrammed in FIG. 15.

Next, a fourth embodiment of the radio transmitter of the present invention is described, with reference to FIGS. 15 and 16. The example configuration of this fourth embodiment corresponds to the configuration diagrammed in FIG. 1(B), and is equivalent to the example in which the circuitry of the second embodiment is configured as digital processing circuitry, which has been described already with reference to FIGS. 6, 7, and 8. The configuring components of the speech processing circuit in the stage before the level-subtraction circuit, moreover, are configured in the same way as in the third embodiment that was explained with reference to FIGS. 11 and 12, so those components are not described further here.

A voice input signal is supplied via the LPF 70 to the A/D converter 72, where it is sampled, with sampling period sufficient to cover the voice band to be transmitted, and converted to a digital voice input signal D1. This digital signal D1 is sent to the speech processing circuit 200. In this circuit 200, the signal D1 passes sequentially through the BPF 202, compressor 204, preemphasis circuit 206, limiter 208, and LPF 210, resulting in a digitally processed and speech-processed digital output signal D2. This output signal D2 from the speech processing circuit 200 is input to a level-subtraction circuit 240.

This level-subtraction circuit 240 is a digital processing circuit, the configuring components of which are controlled by a CPU or other controller. The configuration of this level-subtraction circuit is now described with reference to FIG. 16. The circuitry of the average FM noise level setting stage 242 in this subtraction circuit 240 is different from the circuitry of the average FM noise level setting stage 232 described with reference to FIG. 12. The circuitry in the level-subtraction stage 244 diagrammed in FIG. 16, however, is the same as the circuitry of the level-subtraction stage 234 diagrammed in FIG. 12, so the same reference characters are employed, and no further description is given here.

The threshold setting unit 120 in the average FM noise level setting stage 242 comprises a full-wave rectifier circuit (ABS) 122, a smoothing circuit (LPF) 124 connected to the full-wave rectifier circuit 122, and a coefficient ($\alpha$) multiplier circuit 126 that, connected to the smoothing circuit 124, multiplies the output thereof by the coefficient a and outputs the result as a threshold signal. The level-subtraction stage 244 comprises a first, second, and third sign determining circuit 80, 86, and 88, and a first and second adder circuit 82 and 84. The digital voice signal D2 from the speech processing circuit 200 is supplied at the input terminal of the first sign determining circuit 80 in the level-subtraction stage 244, while the threshold signal from the threshold determining unit 120 is supplied at the second input terminals of the first and second adder circuits 82 and 84.

Configured thusly, moreover, from the FM modulator circuit 22, the AFC signal (AFC) used to stabilize the carrier frequency thereof is split and supplied to the level-subtraction circuit 240. For this reason, a capacitor 92 for removing the DC component from the AFC signal, an LPF 94 for removing the high-level component from the AC component, and an A/D converter 96 for supplying this digital signal as an AFC signal at the input terminal of the full-wave rectifier circuit 122 of the threshold setting unit 120 in the level-subtraction circuit 240, are provided (cf. FIG. 15).

The operation of the level-subtraction circuit 240 is described next. When the AFC signal is input as a digital signal to the full-wave rectifier circuit 122 in the average FM noise level setting stage 242, it is there full-wave rectified, yielding a rectified noise signal which is sent to the smoothing circuit 124. In the smoothing circuit 124, the rectified noise signal from the full-wave rectifier circuit 122 is smoothed to obtain the average FM noise component. This average FM noise component is then sent as the output signal from the smoothing circuit to the multiplier circuit 126, where it is multiplied with the coefficient a to find the average FM noise level Esn, which in turn is sent as the threshold signal to the adder circuits 82 and 84.

The coefficient a is determined as follows.

To begin with, the value of the coefficient a is determined by the relationship between the output level range of the AFC signal and the frequency fluctuation width of the FM carrier wave, and by the relationship between the frequency deviation and the FM modulating signal level. If the modulation sensitivity (a) of the FM modulator circuit 22 is 15 Hz/mV, for example, then, when the FM frequency deviation sensitivity (b) for the AFC signal is 1.5 Hz/mV, a coefficient is needed that will make the relationship between (a) and (b) the same ratio. This coefficient is a. Accordingly, in this case, since 15 Hz/mV=(1.5 Hz/mV)×α, α=15 Hz/mV/1.5 Hz/mV=10.0. The value of this coefficient a is determined as soon as the modulation sensitivity to voltage in the FM modulator circuit 22 and the voltage sensitivity relative to the AFC frequency deviation in the output signal from the smoothing circuit 124 in the threshold setting unit 120 have been found. For this reason, configured as in this example, this coefficient a is rendered a constant value as soon as the characteristics of the components configuring the FM modulator circuit 22 and threshold setting unit 120 are known. This coefficient a, then, is set up so that it will be given as a constant value to the multiplier circuit 126.

Now, when the digital signal D2 is input to the level-subtraction stage 244 in the level-subtraction circuit 240, as was described with reference to FIG. 12, the sign of this signal is assessed, and the digital output signal D3 is finally output.

First of all, when the digital signal D2 is found by the first sign determining circuit 80 to be positive, that signal is sent to the first adder circuit 82. In the first adder circuit 82, the sign of the threshold value Esn is reversed to yield the threshold value −Esn, and this threshold value −Esn is added. As a result, the signal (D2−Esn) is obtained. The sign of this signal (D2−Esn) is determined in the second sign determining circuit 86. If the signal is positive, it is output, without alteration, as the digital output signal D3. If it is negative, it is output as the output signal D3 having an output level of "0."

When the sign in the first sign determining circuit 80 is found to be negative, the negative digital signal D2 and the threshold value Esn are added, and the signal (D2+Esn) is sent to the third sign determining circuit 88. When the signal is found to be positive by the third sign determining circuit 88, it is output as an output signal D3 having an output level of "0," but when it is found to be negative, the signal (D2+Esn) is output, without alteration, as the digital output signal D3.

The output signal D3 obtained in this way is processed in the D/A converter 74 and LPF 76 as already described with reference to FIGS. 11 and 12, and is sent as an analog signal to the FM modulator circuit 22.

According to the example configuration of this fourth embodiment, a level-subtraction circuit 240 is provided in the input stage of the FM modulator circuit 22 for subtracting the average FM noise level (±Esn) for a speech-processed digital voice input signal. Therefore, a speech-processed output signal, from which the average FM noise level has been stripped, is supplied as an analog signal to the FM modulator circuit 22. Accordingly, an improvement in linearity can be realized for the FM modulation level of an input signal at low modulation level.

Figure 17:
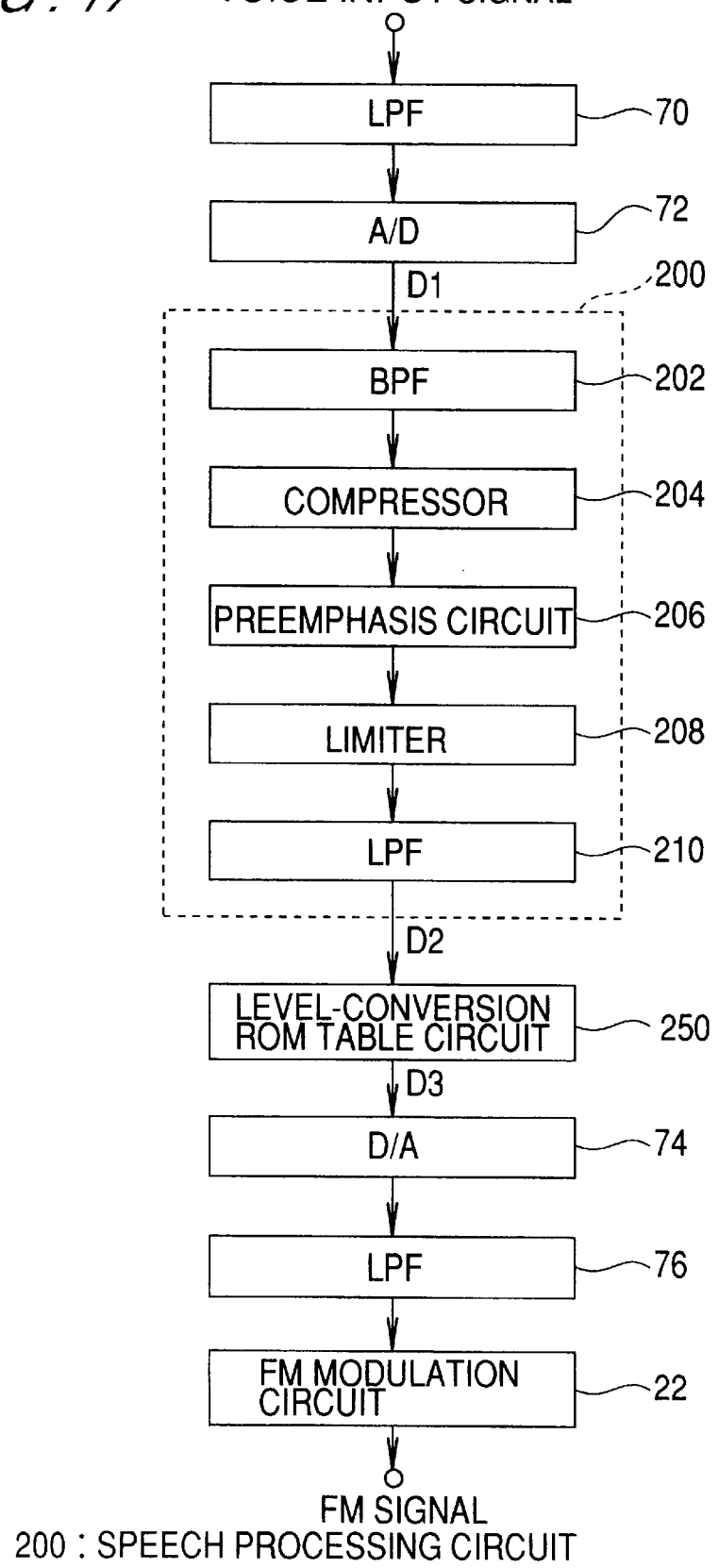
FIG. 17 is a block diagram of an example configuration of a transmitter, provided for describing a fifth embodiment of the frequency modulated signal transmitter of the present invention.

A fifth embodiment of the radio transmitter of the present invention is described next, with reference to FIG. 17. FIG. 17 is a block circuit diagram of the frequency-modulated radio transmitter of the present invention corresponding to FIG. 1(A). In this example configuration, the level-subtraction circuit in the third embodiment, described already in conjunction with FIGS. 11 and 12, is configured with a level-conversion ROM (read-only memory) table circuit. The other configuring components are the same as those diagrammed in FIG. 11, and the same reference characters are employed. Except as necessary, these are not further described here.

The voice input signal, after passing through the LPF 70, is converted to a digital signal D1 by an A/D converter 72 with a sampling period sufficient to cover the voice band to be transmitted. Then, in the speech processing circuit 200, the digital signal D1 is sequentially routed through the BPF 202, compressor 204, preemphasis circuit 206, limiter 208, and LPF 210, and is thereby subjected to digital speech processing. The speech-processed digital signal D2 from this speech processing circuit 200 is then output to a level-conversion ROM table circuit 250.

The level-conversion ROM table circuit 250, using the digital signal D2 as an address signal, outputs a correction output signal that is the sum of the signal D2 level and the average FM noise level (+Esn), that is, the level-regulated voice signal D3. For this reason, the FM noise levels generated in the FM modulator circuit 22 built into this radio transmitter are measured over time to find the average value thereof, that is, the average FM noise level (±Esn). Then the digital values obtained by adding the average noise signal level (−Esn) to the positive digital signal levels and the digital values obtained by adding the average noise signal level (+Esn) to the negative digital signal levels, respectively, are rendered into tabular form and stored. Accordingly, when a digital signal D2 at some level, either positive or negative, is input to the level-conversion ROM table circuit 250, then, in response thereto, the corresponding level-regulated voice signal D3 is output as a digital value from the ROM table circuit 250.

The level-regulated voice signal D3 is converted to an analog signal in the D/A converter 74 and sent to the LPF 76 where signals outside the voice band are attenuated. The signal from this LPF 76 is input to the FM modulator circuit 22. In the FM modulator circuit 22, the signal is FM modulated and output as an FM signal.

By employing the configuration of this fifth embodiment, the linearity of the FM modulation level relative to a low-modulation-level input signal can be improved. In this example configuration, the speech processing circuit 200 is configured with digital processing circuitry, and, when corrections for the FM noise component are made by digital processing, the corrections are made using a ROM table, so that the digital signal processing burden can be reduced, and the correction operation performed more definitely. In addition, the radio transmitter circuitry can be made simpler.

In the description of the several embodiments in the foregoing, the radio transmitters of the present invention were described as transmitters for use on radio channels, but the present invention can also be applied to transmitters for use with land lines, with which applications the same benefits are to be gained.

Moreover, the configuration of the level-subtraction circuit is in no way limited to the several embodiments described above, and can be modified or transformed in many ways.

As is evident from the descriptions contained herein, by employing the frequency modulated signal transmitter of the present invention, frequency modulation is performed using a corrected voice signal obtained by subtracting an average FM noise component from the speech-processed signal, so that the linearity of low-level frequency modulation in a voice signal can be sufficiently secured. As a result, a transmitter exhibiting outstanding S/N characteristics can be provided.

Figure 18:
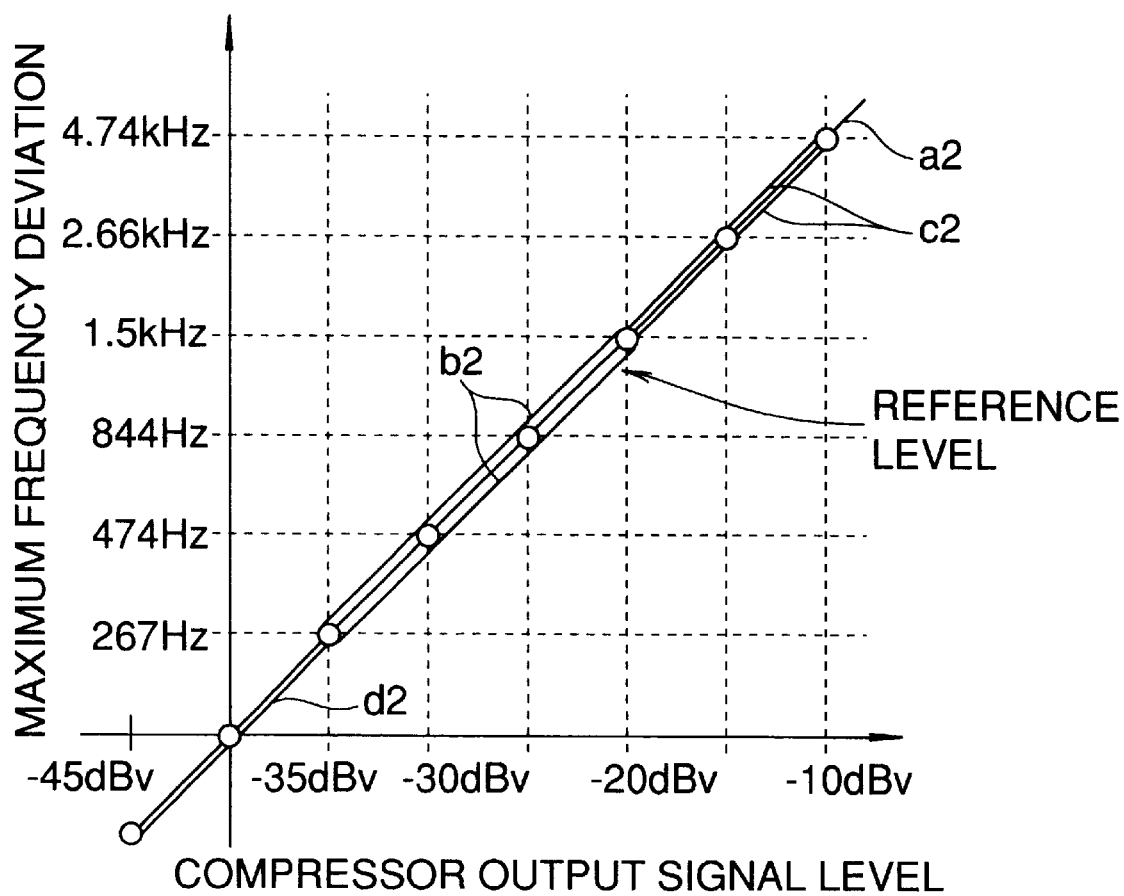
FIG. 18 is a plot of the compressor output signal level vs. the maximum frequency deviation characteristic, provided for describing the noise characteristics of the frequency modulated signal transmitter of the present invention.
Figure 20:
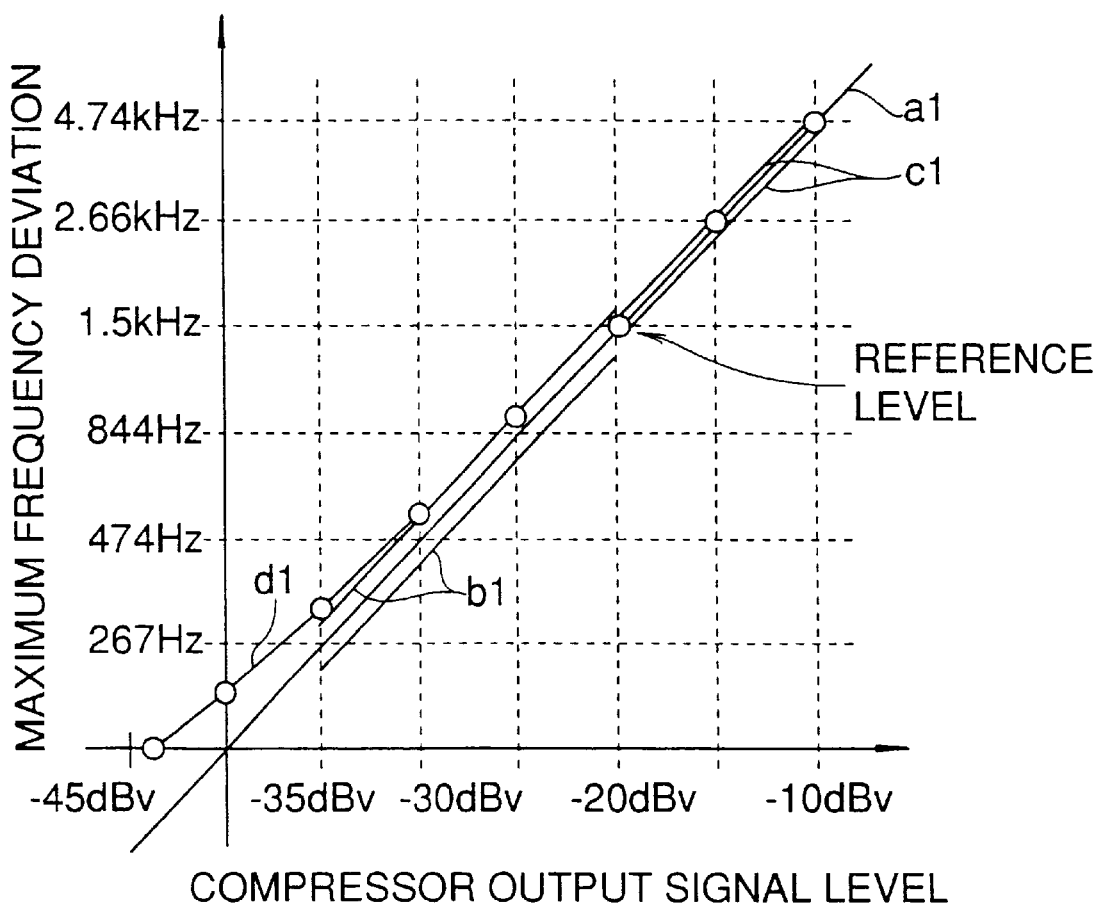
FIG. 20 is a plot of the compressor output signal level vs. the maximum frequency deviation characteristic, provided for describing the noise characteristics of the transmitter diagrammed in FIG. 19.

FIG. 18 is a plot of characteristic curves derived by simulating the maximum FM modulated frequency deviation corresponding to compressor output signal levels in the frequency-modulated signal transmitter of the present invention. The plot in FIG. 18 corresponds to the plot in FIG. 20. The signal level (in dBv) of the output signal from the compressor is plotted on the horizontal axis, and the maximum frequency deviation (in kHz) is plotted on the vertical axis.

In FIG. 18, curve a2 indicates the reference characteristic for the maximum frequency deviation vs. the compressor output signal level. Curve b2 represents the upper and lower limiting values of the standard value fluctuation width within the range from below the reference level (in this case, −20 dBv (1.5 kHz peak deviation) to −35 dBv (267 Hz peak deviation)), in the standard value width of the output signal level from the compressor according to the U.S. TIA-EIA standard IS-90, where the fluctuation width is ±1 dB. Curve c2, similarly, represents the upper and lower limiting values of the standard fluctuation width from above the reference level (−20 dBv (1.5 kHz peak deviation) to −9.54 dBv (5 kHz peak deviation)), where the fluctuation width is ±0.5 dB. And curve d2 is a plot of the maximum frequency deviation against the output signal when FM noise (±50 Hz) is superimposed on a signal in which the 3.0 mV part of the signal has been removed from the output signal of the compressor in the transmitter of the present invention. As may be understood from the results of this simulation, the results represented by curve d2 form a straight line that substantially coincides with the reference characteristic a2. That being so, with the transmitter of the present invention described in the foregoing, it is evident that the linearity of the FM modulation level at low voice signal levels is improved, and that, accordingly, the linearity of the maximum frequency deviation of the FM modulation level for voice input signal levels is also improved.

What is claimed is:

1. An FM signal transmitter comprising:

a speech processing circuit for compressing an input signal and outputting a speech-processed signal;

a frequency modulator circuit for modulating the frequency of a carrier wave with a modulating signal and outputting a frequency-modulated signal (FM signal); and a level-subtraction circuit connected between said speech processing circuit and said frequency modulator circuit;

said level-subtraction circuit subtracts an average FM noise level portion of an FM noise signal generated in said frequency modulator circuit from said speech-processed signal level, generating a level-regulated voice signal, and outputting said level-regulated voice signal as said modulating signal.

2. The FM signal transmitter according to claim 1, wherein said level-subtraction circuit comprises an average FM noise level setting stage for setting said average FM noise level; and a level-subtraction stage, to which said speech-processed signal and said average FM noise level are sent, for performing said subtraction and generating said level-regulated voice signal.

3. The FM signal transmitter according to claim 1, wherein said average FM noise level is a first voltage having a positive value and a second voltage the absolute value of which equals said first voltage; and said level-subtraction stage comprises a first inverting amplifier for inverting and amplifying said speech-processed signal and generating an inverse-amplified signal; a first circuit for offset-voltage-regulating said inverse-amplified signal with said first voltage, half-wave rectifying signal obtained thereby, and generating a positive-polarity signal; a second circuit for offset-voltage-regulating said inverse-amplified signal with said second voltage, half-wave rectifying signal obtained thereby, and generating a negative-polarity signal; an inverting-adder circuit for adding said positive-polarity signal and said negative-polarity signal to produce a combined output signal; and a second inverting-adder for inverting said combined output signal to produce said level-regulated signal.

4. The FM signal transmitter according to claim 1, wherein said first and second inverting amplifiers, said first and second circuits, and said inverting adder circuit are configured using operational amplifiers.

5. The FM signal transmitter according to claim 1, wherein said average FM noise level setting stage is configured with a variable resistor; and said variable resistor has one terminal thereof connected to a constant potential point, the other terminal thereof connected to a ground potential point, and the movable terminal thereof connected to said level-subtraction stage.

6. The FM signal transmitter according to claim 5, wherein said variable resistor comprises a separate first and second variable resistor; said first variable resistor sets a first voltage having a positive value as said average FM noise level; and said second variable resistor sets a second voltage having a negative value as said average FM noise level.

7. The FM signal transmitter according to claim 6, wherein said first and second voltages have the same absolute value.

8. The FM signal transmitter according to claim 1, wherein said level-subtraction circuit is connected to said frequency modulator circuit and comprises an FM noise extractor circuit for extracting said FM noise signal from said frequency modulator circuit.

9. The FM signal transmitter according to claim 8, wherein said FM noise extractor circuit comprises a capacitor.

10. The FM signal transmitter according to claim 9, wherein said frequency modulator circuit comprises a voltage controlled oscillator (VCO); one terminal of said capacitor is connected to the AFC signal input terminal of said voltage controlled oscillator; and said FM noise signal is made the fluctuating component of said AFC signal extracted by said capacitor.

11. The FM signal transmitter according to claim 1, wherein said level-subtraction circuit comprises an average FM noise level setting stage for setting said average FM noise level; and a level-subtraction stage, to which said speech-processed signal and said average FM noise level are sent, for performing said subtraction and generating said level-regulated speech-processed signal; and said average FM noise level setting stage comprises a capacitor, connected to said frequency modulator circuit, for extracting said FM noise signal; a full-wave rectifier for full-wave rectifying said FM noise signal from said capacitor and generating a rectified noise signal; a smoothing circuit for smoothing said rectified noise signal and generating an output signal for said average FM noise level; and an FM noise voltage setting circuit for setting a first voltage as an average FM noise level having a positive value, and a second voltage as an average FM noise level having a negative value, according to said output signal.

12. The FM signal transmitter according to claim 11, wherein said FM noise setting circuit comprises an input terminal to which said output signal is supplied; a first output terminal for use in conjunction with said input terminal for outputting said first voltage; an operational amplifier comprising a positive input terminal connected to a ground potential point, a negative-side input terminal, and a second output terminal for outputting said second voltage; a first resistor connected between said input terminal and said negative-side input terminal; and a second resistor connected between said negative-side input terminal and said second output terminal.

13. The FM signal transmitter according to claim 11, wherein said frequency modulator circuit comprises a voltage controlled oscillator (VCO); and said capacitor is connected to said voltage controlled oscillator so that an AFC signal for controlling the oscillation frequency of said voltage controlled oscillator is supplied to said capacitor.

14. The FM signal transmitter according to claim 2, wherein said speech-processed signal is made a digital signal; and said average FM noise level setting stage is a threshold setting circuit comprising a memory in which said average FM noise level is stored as a threshold value, so as to be readable at any time.

15. The FM signal transmitter according to claim 2, wherein said average FM noise level setting stage comprises a memory in which said average FM noise level is stored as a first voltage having a positive value and a second voltage having a negative value, so as to be readable at any time; and said level-subtraction stage comprises a first sign determining circuit for determining sign of polarity of said speech-processed signal; a first adder circuit for adding said second voltage read out of said memory and said speech-processed signal having positive polarity, in response to a positive determination by said first sign determining circuit, and generating a first added value; a second adder circuit for adding said first voltage read out of said memory and said speech-processed signal having negative polarity, in response to a negative determination by said first sign determining circuit, and generating a second added value; a second sign determining circuit for determining sign of polarity of said first added value, outputting said first added value as said level-regulated voice signal when said determination is positive, and outputting a signal having a voltage level of "0" as the level-regulated voice signal when said determination is negative; and a third sign determining circuit for determining sign of polarity of said second added value, outputting a signal having a voltage level of "0" as the level-regulated voice signal when said determination is positive, and outputting said second added value as said level-regulated voice signal when said determination is negative.

16. The FM signal transmitter according to claim 2, wherein said average FM noise level setting stage comprises a full-wave rectifier circuit for full-wave rectifying said FM noise signal and generating a rectified noise signal; a smoothing circuit for smoothing said rectified noise signal and generating an average frequency fluctuation component for said average FM noise level; and a multiplier circuit for multiplying said average frequency fluctuation component by a coefficient ($\alpha$) to generate a threshold signal, and outputting said threshold signal as an average FM noise level.

17. The FM signal transmitter according to claim 2, wherein said level-subtraction stage comprises a first sign determining circuit for determining sign of polarity of said speech-processed signal; a first adder circuit that, when positive is determined by said first sign determining circuit, generates a first added value by adding said speech-processed signal having positive polarity and a negative value obtained by inverting said average FM noise level; a second adder circuit that, when negative is determined by said first sign determining circuit, generates a second added value by adding said speech-processed signal having negative polarity and a positive value that is said average FM noise level; a second sign determining circuit for determining sign of polarity of said first added value, outputting said first added value as said level-regulated voice signal when said determination is positive, and outputting a signal having a voltage level of "0" as the level-regulated voice signal when said determination is negative; and a third sign determining circuit for determining sign of polarity of said second added value, outputting a signal having a voltage level of "0" as the level-regulated voice signal when said determination is positive, and outputting said second added value as said level-regulated voice signal when said determination is negative.

18. The FM signal transmitter according to claim 15, wherein said frequency modulator circuit comprises a voltage controlled oscillator (VCO); and said FM noise signal is made the fluctuating component of an AFC signal that controls the oscillation frequency of said voltage controlled oscillator.

19. The FM signal transmitter according to claim 18, wherein a capacitor is provided between said full-wave rectifier circuit and said frequency modulator circuit for extracting said FM noise signal from said AFC signal.

20. The FM signal transmitter according to claim 1, wherein said speech-processed signal is made a digital signal; said level-subtraction circuit comprises a ROM table; and said ROM table stores voltage level of said level-regulated voice signal so that said speech-processed signal can be read out as an address signal.

21. The FM signal transmitter according to claim 1, wherein said speech processing circuit and said level-subtraction circuit, respectively, are configured as digital processing circuits.

22. The FM signal transmitter according to claim 1, wherein said speech processing circuit and said level-subtraction circuit, respectively, are configured as analog processing circuits.

23. The FM signal transmitter according to claim 1, wherein said FM transmitter is a radio transmitter.

24. The FM signal transmitter according to claim 1, wherein said FM transmitter is a land-line transmitter.

25. A frequency modulation method comprising:
  (a) a first step for compressing an input signal and forming a speech-processed signal;
  (b) a second step for measuring FM noise signals generated in a frequency modulator circuit and setting an average FM noise level;
  (c) a third step for subtracting only the voltage part of said average FM noise level from said speech-processed signal level and forming a level-regulated speech-process signal; and
  (d) a fourth step for supplying said level-regulated voice signal as a modulating signal to said frequency modulator circuit and outputting a frequency modulated signal from said frequency modulator circuit.

26. The frequency modulation method according to claim 25, wherein said second step comprises a step for measuring individual FM noise levels for a plurality of modulator circuits; and a step for finding average values for said measured plurality of FM noise levels.

27. The frequency modulation method according to claim 25, wherein said average FM noise level is set separately as a first voltage having a positive value and a second voltage having a negative value.

28. The frequency modulation method according to claim 27, wherein said first voltage and said second voltage have the same absolute value.

29. The frequency modulation method according to claim 27, wherein said third step comprises a step for inverting and amplifying said speech-processed signal to generate an inverse-amplified signal; a step for offset-voltage-regulating said inverse-amplified signal with said first voltage, half-wave rectifying signal obtained thereby, and generating a positive-polarity signal; a step for offset-voltage regulating said inverse-amplified signal with said second voltage, half-wave rectifying signal obtained thereby, and generating a negative-polarity signal; a step for adding said positive-polarity and negative-polarity signals to produce a combined output signal; and a step for inverting and amplifying said combined output signal to generate said level-regulated voice signal.

30. The frequency modulation method according to claim 25, wherein said frequency modulator circuit is configured using a voltage controlled oscillator; and said FM noise signal is extracted by removing the DC part of the AFC signal that controls the oscillation frequency of said voltage controlled oscillator.

31. The frequency modulation method according to claim 25, wherein said frequency modulator circuit is configured using a voltage controlled oscillator; and said second step comprises a step for removing the DC part of the AFC signal that controls the oscillation frequency of said voltage controlled oscillator, extracting a fluctuation component signal, and making said fluctuation component signal said FM noise signal; and a step for smoothing said fluctuation component signal, after it has been full-wave rectified, and generating said average FM noise level.

32. The frequency modulation method according to claim 31, wherein said second step also comprises a step for separately setting a first voltage having a positive value and a second voltage having a negative value from said average FM noise level.

33. The frequency modulation method according to claim 32, wherein said first voltage and second voltage have the same absolute value.

34. The frequency modulation method according to claim 25, wherein said speech-processed signal from said input voice signal is generated as a digital signal; said average FM noise level is set as a first voltage having a positive value and a second voltage having the same absolute value as said first voltage, as digital values, in a memory such that they can be read at any time; and said second voltage is read from said memory in response to a positive polarity in said speech-processed signal, while said first voltage is read from said memory in response to a negative polarity therein.

35. The frequency modulation method according to claim 34, wherein said third step comprises a first determining step for determining sign of polarity of said speech-processed signal; a first addition step that, in response to a determination of positive in said first determining step, reads said second voltage out of said memory, adds said second voltage and a positive-polarity speech-processed signal, and generates a first added value; a second addition step that, in response to a determination of negative in said first determining step, reads said first voltage out of said memory, adds said first voltage and a negative-polarity speech-processed signal, and generates a second added value; a second determining step for determining sign of polarity of said first added value, outputting said first added value as said level-regulated voice signal when said determination is positive, and outputting a signal having a voltage level of "0" as the level-regulated voice signal when said determination is negative; and a third determining step for determining sign of polarity of said second added value, outputting a signal having a voltage level of "0" as the level-regulated voice signal when said determination is positive, and outputting said second added value as said level-regulated voice signal when said determination is negative.

36. The frequency modulation method according to claim 25, wherein said second step comprises a step for full-wave rectifying said FM noise signal and generating a rectified noise signal; a step for smoothing said rectified noise signal and generating an average frequency fluctuation component; and a step for multiplying said average frequency fluctuation component by a coefficient (a), generating an average FM noise level, and outputting said average FM noise level.

37. The frequency modulation method according to claim 36, wherein said frequency modulator circuit is configured using a voltage controlled oscillator; and said FM noise signal is extracted by removing the DC part of the AFC signal that controls the oscillating frequency of said voltage controlled oscillator.

* * * * *

UNITED STATES PATENT AND TRADEMARK OFFICE
CERTIFICATE OF CORRECTION

PATENT NO.   : 6,208,845 B1
DATED         : March 27, 2001
INVENTOR(S) : Tatsumasa Yoshida It is certified that error appears in the above-identified patent and that said Letters Patent is hereby corrected as shown below:

Column 4,
Line 27, change "Fig. 1 is a basic block diagram" to -- Figs. 1A and 1B are basic block diagrams --;
Line 31, change "stage." to -- stage, and wherein --;
Line 35, change "example" to -- exemplary --.

Column 21,
Line 46, before "said" insert -- wherein --;
Line 47, after "level" delete "portion";
Line 48, change "generating" to -- generates --;
Line 51, change "outputting" to -- outputs --;

Column 22,
Lines 1 and 4, before "half-wave" insert -- a first --; and after "signal" insert -- being --;
Line 15, change "1" to -- 3 --;
Line 19, change "the other" to -- another --;
Line 20, change "the" to -- a --;
Line 21, change "stage" to -- circuit --;
Line 23, delete "separate"; and after "first" insert -- variable resistor --
Line 24, change "second variable resistor;" to -- a second variable resistor separate from said first variable resistor, --; and
Line 26, change "level;" to -- level, --;

Column 23,
Line 26, change "sign" to -- polarity --;
Line 27, after "determining" delete "sign of";
Line 35, change "sign" to -- polarity --;
Line 37, after "second" change "sign" to -- polarity --; and after "determining" delete "sign of";
Line 42, after "third" change "sign" to -- polarity --; and change "sign of" to -- a --;
Line 61, change "sign" to -- polarity --;
Line 62, after "determining" delete "sign of";
Line 64, after "first" change "sign" to -- polarity --;

UNITED STATES PATENT AND TRADEMARK OFFICE
CERTIFICATE OF CORRECTION

PATENT NO.     : 6,208,845 B1
DATED          : March 27, 2001
INVENTOR(S)    : Tatsumasa Yoshida It is certified that error appears in the above-identified patent and that said Letters Patent is hereby corrected as shown below:

Column 24,
Line 2, after "first" change "sign" to -- polarity --;
Line 5, after "second" change "sign" to -- polarity --;
Lines 5 and 6, after "determining" change "sign of" to -- a --;
Line 10, after "third" change "sign" to -- polarity --;
Line 11, after "for determining" change "sign of" to -- a --;
Line 29, before "voltage" insert -- a --;

Column 25,
Line 37, change "value" to -- value, --.

Signed and Sealed this

First Day of July, 2003

JAMES E. ROGAN
*Director of the United States Patent and Trademark Office*